US012772669B2

(12) United States Patent
Ka et al.

(10) Patent No.: US 12,772,669 B2
(45) Date of Patent: Oct. 20, 2026

(54) DISPLAY DEVICE AND MANUFACTURING METHOD OF DISPLAY DEVICE

(71) Applicant: Samsung Display Co., Ltd., Yongin-si (KR)

(72) Inventors: Jae Yong Ka, Yongin-si (KR); Joon Yong Park, Yongin-si (KR); Hyun Eok Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 218 days.

(21) Appl. No.: 18/488,267

(22) Filed: Oct. 17, 2023

(65) Prior Publication Data

US 2024/0334756 A1 Oct. 3, 2024

(30) Foreign Application Priority Data

Mar. 29, 2023 (KR) ........................ 10-2023-0041395

(51) Int. Cl.

| | |
|---|---|
| ***H10K 59/123*** | (2023.01) |
| ***H10K 59/12*** | (2023.01) |
| ***H10K 59/122*** | (2023.01) |
| ***H10K 59/131*** | (2023.01) |
| ***H10K 59/38*** | (2023.01) |
| ***H10K 59/80*** | (2023.01) |
| ***H10K 85/10*** | (2023.01) |
| ***H10K 102/00*** | (2023.01) |

(52) U.S. Cl.

CPC ....... *H10K 59/123* (2023.02); *H10K 59/1201* (2023.02); *H10K 59/122* (2023.02); *H10K 59/131* (2023.02); *H10K 59/38* (2023.02); *H10K 85/1135* (2023.02); *H10K 59/879* (2023.02); *H10K 2102/351* (2023.02)

(58) Field of Classification Search

None

See application file for complete search history.

(56) References Cited

U.S. PATENT DOCUMENTS

| | | | | |
|---|---|---|---|---|
| 6,340,496 | B1 | 1/2002 | Cloots et al. | |
| 7,241,652 | B2 | 7/2007 | Park et al. | |
| 8,852,979 | B2 | 10/2014 | Min et al. | |
| 9,368,560 | B2 | 6/2016 | Jeon et al. | |
| 2008/0100590 | A1 * | 5/2008 | Hur | G06F 3/047 345/173 |

(Continued)

FOREIGN PATENT DOCUMENTS

| | | | |
|---|---|---|---|
| KR | 10-2001-0020856 | A | 3/2001 |
| KR | 10-1064773 | B1 | 9/2011 |

(Continued)

*Primary Examiner* — Sue A Purvis

*Assistant Examiner* — Jordan M Klein

(74) *Attorney, Agent, or Firm* — Womble Bond Dickinson (US) LLP

(57) ABSTRACT

A display device may include a substrate including an emission area and a non-emission area, a transistor electrode above the substrate, a via layer over the transistor electrode, and defining a first opening exposing the transistor electrode, an organic layer above the via layer to fill the first opening, a first electrode above the organic layer, and electrically connected to the transistor electrode through the organic layer, an emission layer above the first electrode, and a second electrode over the emission layer.

18 Claims, 17 Drawing Sheets

(56) References Cited

U.S. PATENT DOCUMENTS

| | | | | |
|---|---|---|---|---|
| 2014/0167000 | A1* | 6/2014 | Jeon | H10K 59/123 438/34 |
| 2019/0157362 | A1* | 5/2019 | Rho | H10K 59/878 |
| 2022/0326526 | A1* | 10/2022 | Kamo | G02B 27/0179 |

FOREIGN PATENT DOCUMENTS

| | | | |
|---|---|---|---|
| KR | 10-1407209 | B1 | 6/2014 |
| KR | 10-2034870 | B1 | 10/2019 |

* cited by examiner

DISPLAY DEVICE AND MANUFACTURING METHOD OF DISPLAY DEVICE

CROSS-REFERENCE TO RELATED APPLICATION

The present application claims priority to, and the benefit of, Korean patent application No. 10-2023-0041395 filed on Mar. 29, 2023, in the Korean Intellectual Property Office, the entire disclosure of which is incorporated herein by reference.

BACKGROUND

1. Field

The present disclosure generally relates to a display device, and to a manufacturing method of a display device.

2. Description of the Related Art

As the information society is developed, demands for display devices for displaying images have increased in various forms. For example, the display devices have been applied to various electronic devices, such as smartphones, digital cameras, notebook computers, navigation systems, and smart televisions.

A display device may be a flat panel display device, such as a liquid crystal display device, a field emission display device, or a light-emitting display device. The light-emitting display device includes an organic light-emitting display device including an organic light-emitting element, an inorganic light-emitting display device including an inorganic light-emitting element, such as an inorganic semiconductor, and/or a subminiature light-emitting display device including a subminiature light-emitting element.

The organic light-emitting display device is a self-luminous display device, which is provided with an organic light-emitting element including a hole injection electrode, an electron injection electrode, and an organic emission layer formed therebetween, and generates light when excitons generated as holes injected from the hole-injection electrode and electrons injected from the electron-injection electrode are combined in the organic emission layer drop from an excitation state to a ground state. Because the organic light-emitting display device has a relatively rapid response speed, and is driven at low power, the organic light-emitting display device has come into the spotlight as a next-generation display.

SUMMARY

Embodiments provide a display device capable of reducing or minimizing deterioration of the light emission efficiency of an organic emission layer due to a height difference occurring according to a position of the organic emission layer.

Embodiments also provide a manufacturing method of the display device.

In accordance with an aspect of the present disclosure, there is provided a display device including a substrate including an emission area and a non-emission area, a transistor electrode above the substrate, a via layer over the transistor electrode, and defining a first opening exposing the transistor electrode, an organic layer above the via layer to fill the first opening, a first electrode above the organic layer, and electrically connected to the transistor electrode through the organic layer, an emission layer above the first electrode, and a second electrode over the emission layer.

The organic layer may have a substantially flat surface on the via layer, wherein the first electrode is above the substantially flat surface.

The organic layer may include a first area overlapping the emission area, and a second area overlapping the non-emission area, wherein the first area includes a conductive organic layer, and wherein the second area includes a non-conductive organic layer.

The first electrode may completely cover the first area of the organic layer, and may overlap a portion of the second area of the organic layer.

The display device may further include a pixel-defining layer over the first electrode, wherein the pixel-defining layer defines a second opening overlapping with the emission area.

The first electrode may be exposed by the second opening, wherein the emission layer is in the second opening, and wherein the second electrode is above the pixel-defining layer.

The second area of the organic layer may overlap the pixel-defining layer.

The display device may further include a bank pattern above the pixel-defining layer, wherein the second electrode covers the pixel-defining layer and the bank pattern.

The first electrode might not be in direct contact with the via layer.

The first electrode might not be in the first opening of the via layer.

The emission layer may include a hole-transporting layer, an organic emission layer, and an electron-transporting layer, which are sequentially arranged.

The display device may further include a color filter above the second electrode, and an optical layer above the color filter, and including a pancake lens.

The first opening may overlap the emission area.

The organic layer may include poly(3,4-ethylenedioxythiophene)poly(styrenesulfonate) (PEDOTPSS).

The display device may further include a pixel circuit layer above the substrate, the pixel circuit layer including a first transistor, a gate-insulating layer, and a protective layer, wherein the first transistor includes a semiconductor pattern covered by the gate-insulating layer, a gate electrode above the gate-insulating layer, and a first terminal and a second terminal connected to the semiconductor pattern, and wherein the transistor electrode is electrically connected to one of the first terminal and the second terminal.

In accordance with another aspect of the present disclosure, there is provided a method of manufacturing a display device, the method including forming a transistor electrode on a substrate, forming, over the transistor electrode, a via layer defining a first opening exposing the transistor electrode, forming, on the via layer, an organic layer forming a flat surface by filling the first opening, forming, on the organic layer, a first electrode electrically connected to the transistor electrode, forming an emission layer on the first electrode, and forming a second electrode over the emission layer.

The method may further include forming a pixel-defining layer defining a second opening exposing the first electrode, wherein the forming of the emission layer on the first electrode includes forming the emission layer on the first electrode exposed through the second opening.

The method may further include forming a bank pattern on the pixel-defining layer, wherein the forming of the second electrode includes covering the pixel-defining layer and the bank pattern with the second electrode.

The forming of the organic layer may include entirely applying an organic material on the via layer, heat-treating the organic material, patterning a first area of the organic layer, which corresponds to emission area, and exposing an insulation solution to a second area of the organic layer, which corresponds to a non-emission area.

The first area of the organic layer may include a conductive organic layer, wherein the second area of the organic layer includes a non-conductive organic layer.

BRIEF DESCRIPTION OF THE DRAWINGS

Embodiments will now be described more fully hereinafter with reference to the accompanying drawings. However, the embodiments may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. Like reference numerals refer to like elements throughout.

DETAILED DESCRIPTION

Figure 1:
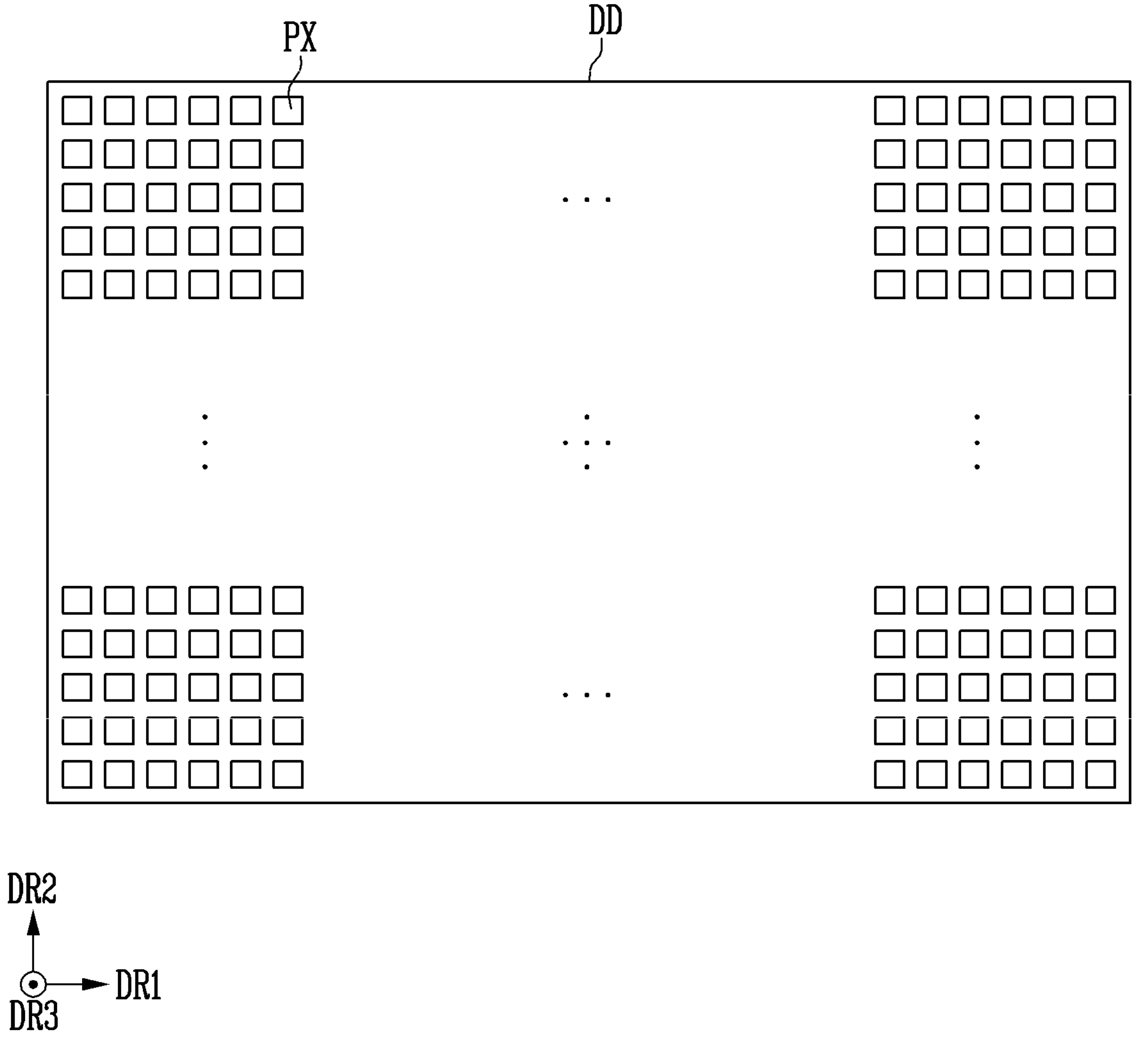
FIG. 1 is a schematic plan view illustrating a display device in accordance with embodiments of the present disclosure.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The present disclosure covers all modifications, equivalents, and replacements within the idea and technical scope of the present disclosure. Further, each of the features of the various embodiments of the present disclosure may be combined or combined with each other, in part or in whole, and technically various interlocking and driving are possible. Each embodiment may be implemented independently of each other or may be implemented together in an association.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. “About” or “approximately,” as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value. Further, the use of “may” when describing embodiments of the present disclosure refers to “one or more embodiments of the present disclosure.”

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
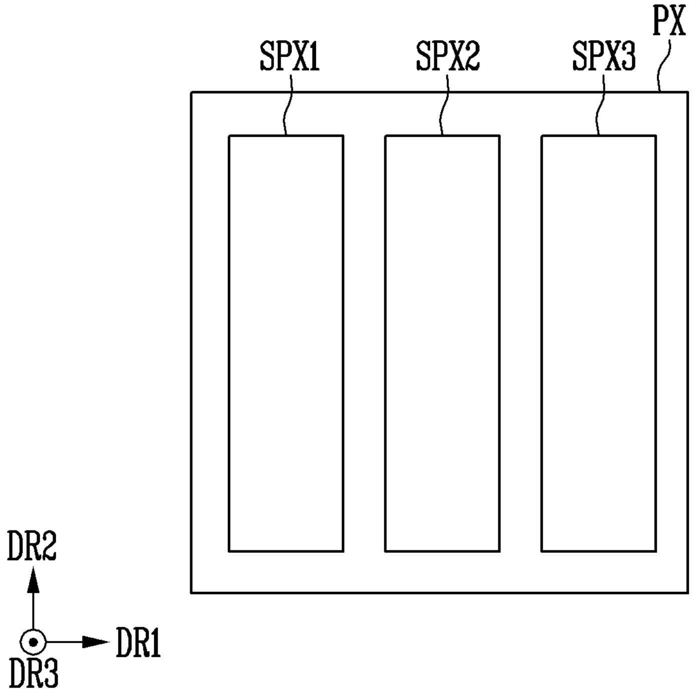
FIG. 2 is a sectional view illustrating one or more embodiments of a pixel shown in FIG. 1.

FIG. 1 is a schematic plan view illustrating a display device in accordance with embodiments of the present disclosure. FIG. 2 is a sectional view illustrating one or more embodiments of a pixel shown in FIG. 1.

Referring to FIG. 1, the display device DD is a device which displays a moving image or a still image, and may be used as a display screen of not only portable electronic devices, such as a mobile phone, a smart phone, a tablet personal computer (PC), a mobile communication terminal, an electronic notebook, an electronic book, a portable multimedia player (PMP), a navigation system, and an ultra-mobile PC, but also various products, such as a television, a notebook computer, a monitor, an advertisement board, and Internet of things (IOT).

The display device DD may be formed in a rectangular plane having long sides in a first direction DR1, and short sides in a second direction DR2 intersecting the first direction DR1. A corner at which the long side in the first direction DR1 and the short side in the second direction DR2 meet each other may be formed round to have a curvature (e.g., predetermined curvature), or be formed at a right angle. The planar shape of the display device DD is not limited to a quadrangular shape, and the display device DD may be formed in another polygonal shape, a circular shape, or an elliptical shape. The display device DD may be formed flat, but the present disclosure is not limited thereto. For example, the display device DD may include a curved part which is formed at a left/right end and has a constant curvature or a changing curvature. In addition, the display device DD may be formed flexible enough to be warpable, curvable, bendable, foldable or rollable.

The display device DD may further include pixels PX for displaying an image, scan lines extending in the first direction DR1, and data lines extending in the second direction DR2. The pixels PX may be arranged in a matrix form in the first direction DR1 and the second direction DR2.

Referring to FIGS. 1 and 2, each of the pixels PX may include a plurality of sub-pixels SPX1, SPX2, and SPX3. In FIG. 2, it is shown that each of the pixels PX includes three sub-pixels SPX1, SPX2, and SPX3 (e.g., a first sub-pixel SPX1, a second sub-pixel SPX2, and a third sub-pixel SPX3). However, the present disclosure is not limited thereto.

The first sub-pixel SPX1, the second sub-pixel SPX2, and the third sub-pixel SPX3 may be connected to any one data line among the data lines, and at least one scan line among the scan lines.

Each of the first sub-pixel SPX1, the second sub-pixel SPX2, and the third sub-pixel SPX3 may have a rectangular, square, or rhombic planar shape. For example, each of the first sub-pixel SPX1, the second sub-pixel SPX2, and the third sub-pixel SPX3 may have a rectangular planar shape having short sides in the first direction DR1, and long sides in the second direction DR2. In some embodiments, each of the first sub-pixel SPX1, the second sub-pixel SPX2, and the third sub-pixel SPX3 may have a square or rhombic planar shape including sides having the same length in the first direction DR1 and the second direction DR2.

The first sub-pixel SPX1, the second sub-pixel SPX2, and the third sub-pixel SPX3 may be arranged in the first direction DR1. In one or more embodiments, any one of the second sub-pixel SPX2, the third sub-pixel SPX3, and/or the first sub-pixel SPX1 may be arranged in the first direction DR1, and the other of the second sub-pixel SPX2 and the third sub-pixel SPX3 and the first sub-pixel SPX1 may be arranged in the second direction DR2.

In one or more embodiments, any one of the first sub-pixel SPX1, the third sub-pixel SPX3, and/or the second sub-pixel SPX2 may be arranged in the first direction DR1, and the other of the first sub-pixel SPX1 and the third sub-pixel SPX3 and the second sub-pixel SPX2 may be arranged in the second direction DR2. In other embodiments, any one of the first sub-pixel SPX1, the second sub-pixel SPX2, and/or the third sub-pixel SPX3 may be arranged in the first direction DR1, and the other of the first sub-pixel SPX1 and the second sub-pixel SPX2 and the third sub-pixel SPX3 may be arranged in the second direction DR2.

The first sub-pixel SPX1 may emit first light, the second sub-pixel SPX2 may emit second light, and the third sub-pixel SPX3 may emit third light. The first light may be light in a red wavelength band, the second light may be light in a green wavelength band, and the third light may be light in a blue wavelength band. The red wavelength band may be a wavelength band of about 600 nm to about 750 nm, the green wavelength band may be a wavelength band of about 480 nm to about 560 nm, and the blue wavelength band may be a wavelength band of about 370 nm to about 460 nm. However, the present disclosure is not limited thereto.

Each of the first sub-pixel SPX1, the second sub-pixel SPX2, and the third sub-pixel SPX3 may include a light-emitting element LD (see FIG. 4) for emitting light, and the light-emitting element LD may include an organic light-emitting element having an organic layer.

An area of the first sub-pixel SPX1, an area of the second sub-pixel SPX2, and an area of the third sub-pixel SPX3 may be the substantially same, but the embodiments of the present disclosure are not limited thereto. At least one of the area of the first sub-pixel SPX1, the area of the second sub-pixel SPX2, and the area of the third sub-pixel SPX3 may be different from another of the area of the first sub-pixel SPX1, the area of the second sub-pixel SPX2, and the area of the third sub-pixel SPX3. Alternatively, any two of the area of the first sub-pixel SPX1, the area of the second sub-pixel SPX2, and/or the area of the third sub-pixel SPX3 may be the substantially same, and the other of the first sub-pixel SPX1, the area of the second sub-pixel SPX2, and the area of the third sub-pixel SPX3 may be different from the two of the area of the first sub-pixel SPX1, the area of the second sub-pixel SPX2, and the area of the third sub-pixel SPX3. Alternatively, the area of the first sub-pixel SPX1, the area of the second sub-pixel SPX2, and the area of the third sub-pixel SPX3 may be different from one another.

Figure 3:
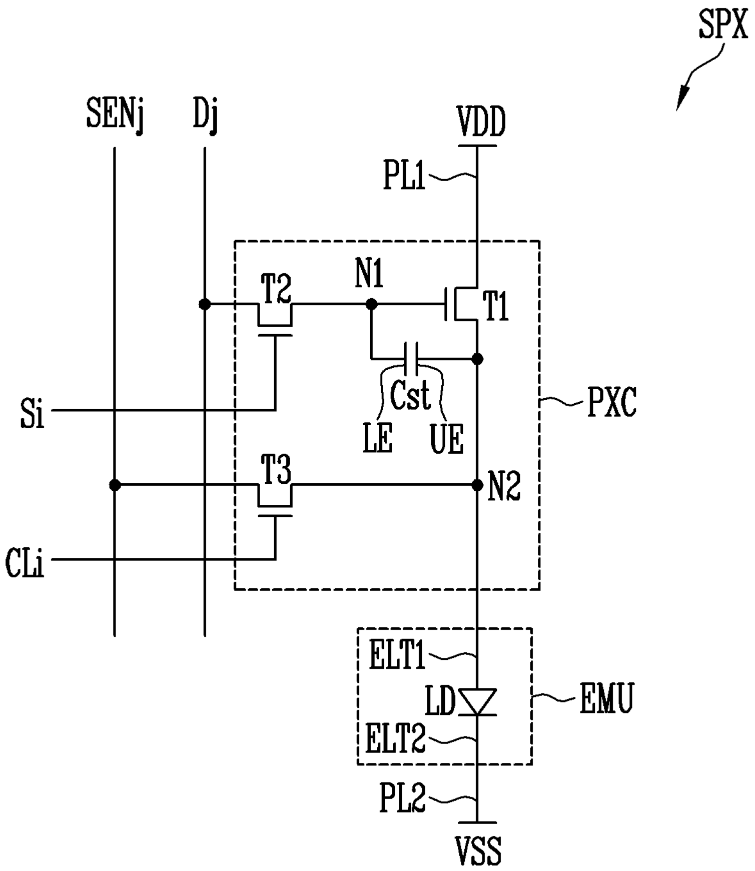
FIG. 3 is a circuit diagram illustrating one or more embodiments of a sub-pixel included in the pixel shown in FIG. 2.

FIG. 3 is a circuit diagram illustrating one or more embodiments of the sub-pixel included in the pixel shown in FIG. 2.

A sub-pixel SPX shown in FIG. 3 may be any one of the sub-pixels SPX1, SPX2, and/or SPX3 shown in FIG. 2, and sub-pixels SPX1 to SPX3 arranged in a display area of each display device DD may be configured substantially identically or similarly to one another.

For convenience of description, a sub-pixel SPX located on an ith pixel row (or ith horizontal line) and a jth pixel column will be illustrated in FIG. 3 (i and j are natural numbers).

Referring to FIG. 3, the sub-pixel SPX may include a light-emitting unit EMU that generates light with a luminance corresponding to a data signal. Also, the sub-pixel SPX may further include a pixel circuit PXC for driving the light-emitting unit EMU.

The light-emitting unit EMU may include a light-emitting element LD connected between a first power line PL1 supplied with a voltage of a first driving power source VDD (or first power source), and a second power line PL2 supplied with a voltage of a second driving power source VSS (or second power source). In one or more embodiments, the light-emitting unit EMU may include a light-emitting element LD including a first electrode ELT1 connected to the first driving power source VDD via the pixel circuit PXC and the first power line PL1, and including a second electrode ELT2 connected to the second driving power source VSS via the second power line PL2. The first electrode ELT1 may be an anode, and the second electrode ELT2 may be a cathode. The first driving power source VDD and the second driving power source VSS may have different potentials. A potential difference between the first and second driving power sources VDD and VSS may be set equal to or higher than a threshold voltage of the light-emitting element LD during an emission period of a pixel PXL.

When the sub-pixel SPX is located on an ith pixel row and a jth pixel column in the display area of the display device DD, the pixel circuit PXC of the sub-pixel SPX may be electrically connected to an ith scan line Si and a jth data line Dj. Also, the pixel circuit PXC may be electrically connected to an ith control line CLi and a jth sensing line SENj.

The above-described pixel circuit PXC may include first to third transistors T1, T2, and T3, and a storage capacitor Cst.

The first transistor T1 is a driving transistor for controlling a driving current applied to the light-emitting element LD, and may be electrically connected between the first driving power source VDD and the light-emitting element LD. For example, a first terminal of the first transistor T1 may be electrically connected to the first driving power source VDD through the first power line PL1. A second terminal of the first transistor T1 may be electrically connected to a second node N2. A gate electrode of the first transistor T1 may be electrically connected to a first node N1. The first transistor T1 may control an amount of driving current applied from the first driving power source VDD to the light-emitting element LD through the second node N2 according to a voltage applied to the first node N1. In one or more embodiments, the first terminal of the first transistor T1 may be a drain electrode, and the second terminal of the first transistor T1 may be a source electrode. However, the present disclosure is not limited thereto. In some embodiments, the first terminal may be the source electrode, and the second terminal may be the drain electrode.

The second transistor T2 is a switching transistor that selects a sub-pixel SPX in response to a scan signal and activates the sub-pixel SPX, and may be electrically connected between a data line Dj (e.g., the jth data line) and the first node N1. A first terminal of the second transistor T2 may be electrically connected to the data line Dj. A second terminal of the second transistor T2 may be electrically connected to the first node N1 (or the gate electrode of the first transistor T1). A gate electrode of the second transistor T2 may be electrically connected to a scan line Si (or the ith scan line). The first terminal and the second terminal of the second transistor T2 are different terminals. For example, when the first terminal is a drain electrode, the second terminal may be a source electrode.

The second transistor T2 may be turned on when a scan signal having a gate-on voltage (e.g., a high level voltage) is supplied from the scan line Si, to thereby electrically connect the data line Dj and the first node N1 to each other. The first node N1 is a point at which the second terminal of the second transistor T2 and the gate electrode of the first transistor T1 are connected to each other, and the second transistor T2 may transfer a data signal to the gate electrode of the first transistor T1.

The third transistor T3 may electrically connect the first transistor T1 to a sensing line SENj (e.g., the jth sensing line), to thereby acquire a sensing signal through the sensing line SENj, and to detect a characteristic of the sub-pixel SPX, including a threshold voltage of the first transistor T1, and the like, by using the sensing signal. Information on the characteristic of the sub-pixel SPX may be used to convert image data, such that a characteristic deviation between sub-pixels SPX can be compensated. A second terminal of the third transistor T3 may be electrically connected to the second terminal of the first transistor T1, a first terminal of the third transistor T3 may be electrically connected to the sensing line SENj, and a gate electrode of the third transistor T3 may be electrically connected to a control line CLi (e.g., the ith control line). The first terminal may be a drain electrode, and the second terminal may be a source electrode.

The third transistor T3 is an initialization transistor capable of initializing the second node N2, and may be turned on when a sensing control signal is supplied from the control line CLi, to transfer a voltage of an initialization power source to the second node N2. Accordingly, the storage capacitor Cst electrically connected to the second node N2 can be initialized.

The storage capacitor Cst may include a lower electrode LE (or first storage electrode) and an upper electrode UE (or second storage electrode). The lower electrode LE may be electrically connected to the first node N1, and the upper electrode UE may be electrically connected to the second node N2. The storage capacitor Cst charges a data voltage corresponding to a data signal supplied to the first node N1 during one frame period. Accordingly, the storage capacitor Cst can store a voltage corresponding to a difference between a voltage of the gate electrode of the first transistor T1 and a voltage of the second node N2.

Although one or more embodiments in which the first to third transistors T1, T2, and T3 are all N-type transistors has been disclosed in FIG. 3, the present disclosure is not limited thereto. For example, at least one of the above-described first to third transistors T1, T2, and T3 may be replaced with a P-type transistor. The structure of the pixel circuit PXC may be variously modified and embodied.

Figure 4:
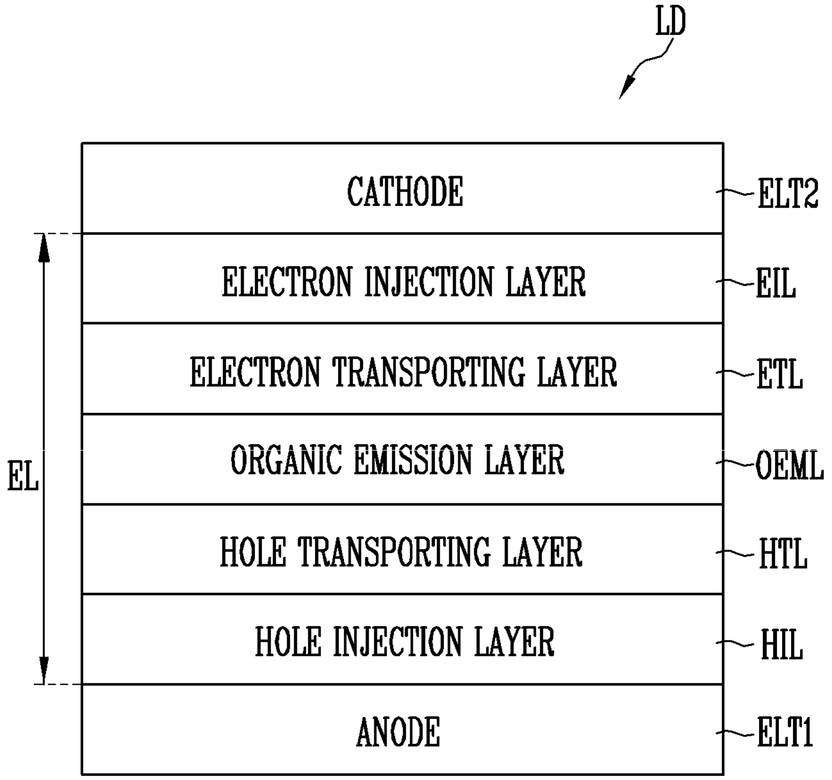
FIG. 4 is a sectional view schematically illustrating a light-emitting element shown in FIG. 3.

FIG. 4 is a sectional view schematically illustrating the light-emitting element shown in FIG. 3.

The light-emitting element LD may include a first electrode ELT1 (or first electrode layer), an emission layer EL, and a second electrode ELT2 (or second electrode layer).

The first electrode ELT1 may be an anode electrode for the emission layer EL, and the second electrode ELT2 may be a cathode electrode for the emission layer EL. In some embodiments, the first electrode ELT1 and the second electrode ELT2 may include a conductive material. For example, the first electrode ELT1 may include a conductive material having reflexibility, and the second electrode ELT2 may include a transparent conductive material. However, the present disclosure is not necessarily limited thereto. The first electrode ELT1 may include a transparent conductive material, and the second electrode ELT2 may include a conductive material having reflexibility.

Figure 6:
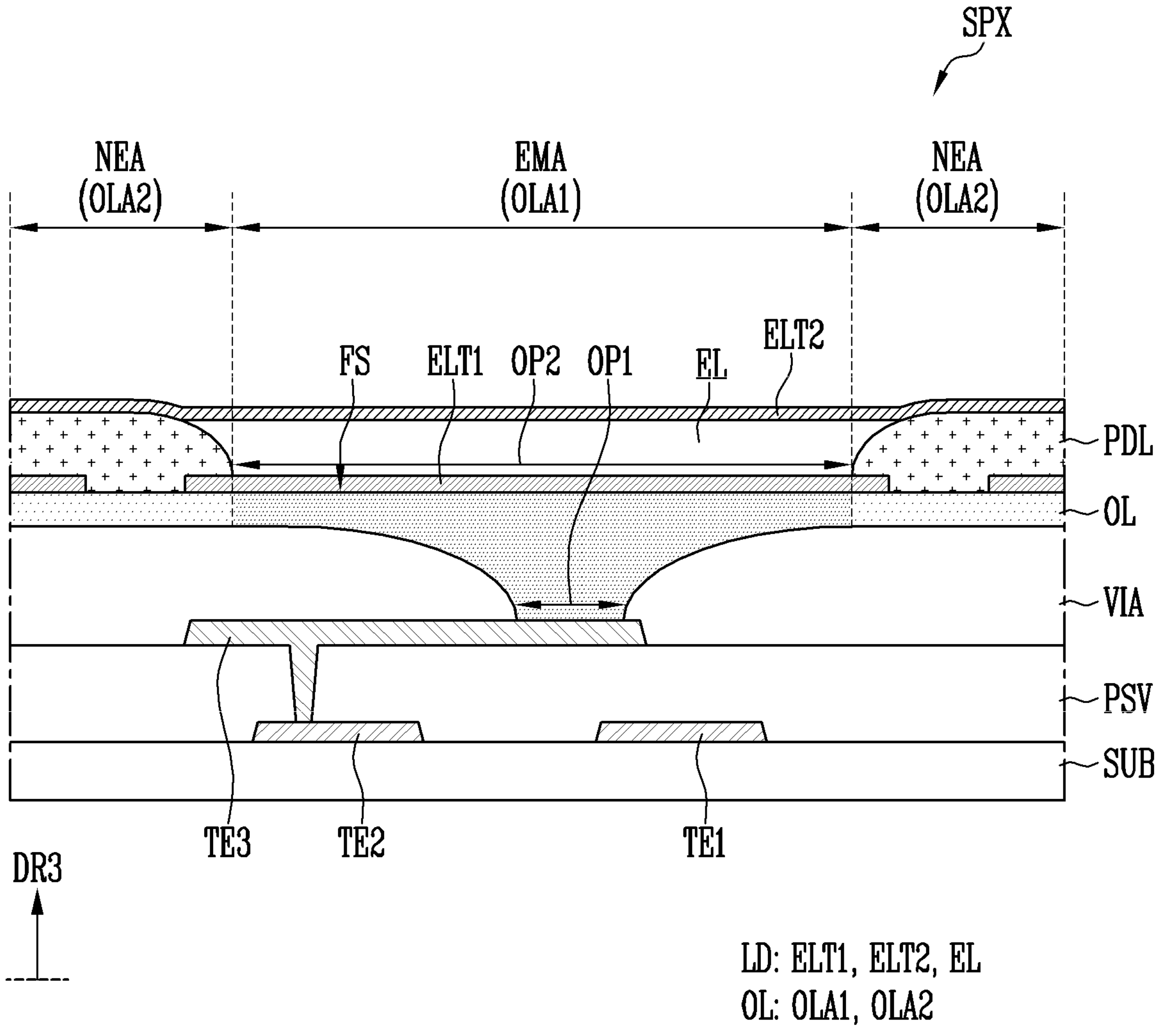
FIG. 6 is a schematic sectional view illustrating one or more embodiments of the sub-pixel included in the display device shown in FIG. 1.

The emission layer EL may be located in an area (e.g., first to third sub-pixels SPX1 to SPX3 shown in FIG. 8) defined by a pixel-defining layer (e.g., a pixel-defining layer PDL shown in FIG. 6). One surface of the emission layer EL may be electrically connected to the first electrode ELT1, and the other surface of the emission layer EL may be electrically connected to the second electrode ELT2.

The emission layer EL may emit one light among red light, green light, and/or blue light, but the present disclosure is not limited thereto.

The emission layer EL may have a multi-layer thin film structure including a light generation layer. The emission layer EL may include a hole injection layer HIL, a hole-transporting layer HTL, an organic emission layer OEML, an electron-transporting layer ETL, and an electron injection layer EIL.

The hole injection layer HIL may be a layer into which holes are injected. The hole-transporting layer HTL may be a layer for increasing recombination opportunity of holes and electrons by suppressing movement of electrons that are not combined in the organic emission layer OEML. The organic emission layer OEML may be a layer for emitting light by recombination of the injected electrons and holes. The electron injection layer EIL may be a layer into which electrons are injected. The electron-transporting layer ETL may be a layer for smoothly transporting electrons to the organic emission layer OEML. The emission layer EL may emit light based on an electrical signal provided from the first electrode ELT1 and the second electrode ELT2.

Figure 5:
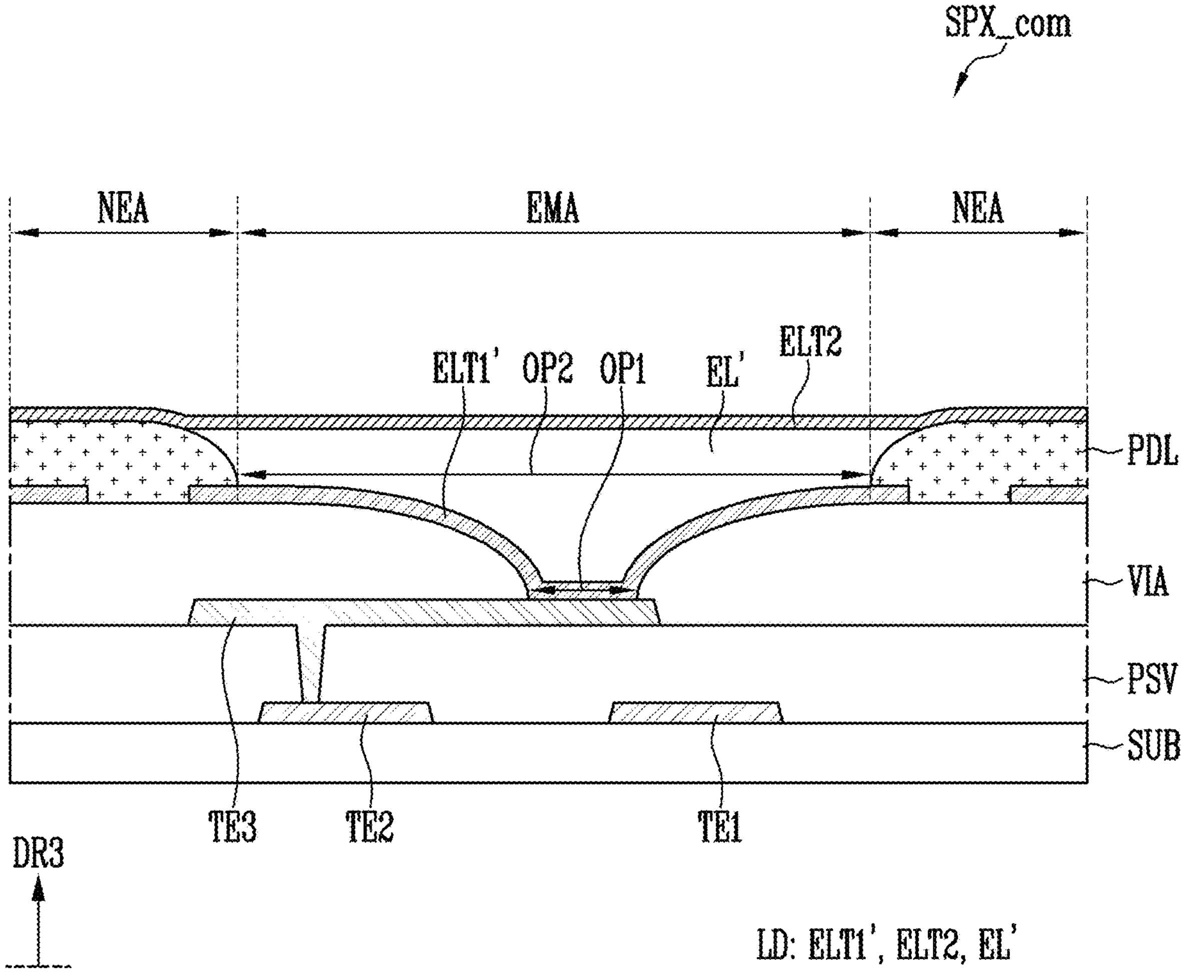
FIG. 5 is a sectional view illustrating a comparative example of the sub-pixel included in the display device.

Hereinafter, FIG. 5 is a view illustrating, as a comparative example, a comparative sub-pixel SPX_com including a first electrode ELT1 located directly on a transistor electrode TE3.

FIG. 5 is a sectional view illustrating a comparative example of the sub-pixel included in the display device.

The comparative sub-pixel SPX_com may include an emission area EMA and a non-emission area EMA.

First and second terminals TE1 and TE2 may be located on a substrate SUB. A protective layer PSV may be located over the first and second terminals TE1 and TE2. A transistor electrode TE3 may be located on the protective layer PSV. The transistor electrode TE3 may be electrically connected to the second terminal TE2. The transistor electrode TE3 may be electrically connected to the second terminal TE2 through a contact hole penetrating the protective layer PSV.

A via layer VIA may be located over the transistor electrode TE3. The via layer VIA may include a first opening OP1 for exposing the transistor electrode TE3. The first opening OP1 may overlap with the emission area EMA when viewed on a plane.

A first electrode ELT1' may be located on the via layer VIA. The first electrode ELT1' may be located on the transistor electrode TE3 exposed through the first opening OP1. The first electrode ELT1' may be in direct contact with the transistor electrode TE3.

The first electrode ELT1' may have a surface profile corresponding to the shape of the via layer VIA. As the first electrode ELT1' is located on the first opening OP1 penetrating the via layer VIA, a height difference occurs between the first electrode ELT1' located on the via layer VIA and the first electrode ELT1' located on the transistor electrode TE3. A step difference may be formed at a portion of the first electrode ELT1', which corresponds to the first opening OP1.

An emission layer EL' may be located on the first electrode ELT1' in a second opening OP2 of a pixel-defining layer PDL. As the emission layer EL' is located above the first electrode ELT1', the emission layer EL' may fill the first opening OP1 of the via layer VIA. That is, as the emission layer EL' covers the step difference formed in the first electrode ELT1', a height of the emission layer EL' may vary according to a position at which the emission layer EL' is located. As the height of the emission layer EL' varies according to the position at which the emission layer EL' is located, the light emission efficiency of the emission layer EL' may be deteriorated (e.g., a resonance effect is deteriorated). As described above, when the emission layer EL' is located on the first electrode ELT1' including the step difference, the height (or thickness) of the emission layer EL' might not be uniform, and therefore, the light emission efficiency of a light-emitting element LD may be deteriorated. Accordingly, the reliability of a display device including the comparative sub-pixel SPX_com may be lowered.

FIG. 6 is a schematic sectional view illustrating one or more embodiments of the sub-pixel included in the display device shown in FIG. 1.

Referring to FIG. 6, a sub-pixel SPX may include a substrate SUB, a protective layer PSV, a via layer VIA, a light-emitting element LD, and a pixel-defining layer PDL.

First and second terminals TE1 and TE2 may be located on the substrate SUB. In one or more embodiments, the first and second terminals TE1 and TE2 may be electrodes constituting a transistor (e.g., the first transistor T1 shown in FIG. 3).

The protective layer PSV may be provided and/or formed over the first and second terminals TE1 and TE2. The protective layer PSV may be provided in a form including an inorganic insulating layer located on an organic insulating layer, or including an organic insulating layer located on an inorganic insulating layer.

A transistor electrode TE3 may be located on the protective layer PSV. The transistor electrode TE3 may be electrically connected to one of the first and second terminals TE1 and TE2. In FIG. 6, it is illustrated that the transistor electrode TE3 is electrically connected to the second terminal TE2. However, the present disclosure is not limited thereto, and the transistor electrode TE3 may be electrically connected to the first terminal TE1.

The transistor electrode TE3 may be electrically connected to the second terminal TE2 through a contact hole penetrating the protective layer PSV.

The via layer VIA may be entirely provided and/or formed on the protective layer PSV. The via layer VIA may be an inorganic insulating layer including an inorganic material, or may be an organic insulating layer including an organic material.

The via layer VIA may include a first opening OP1 exposing the transistor electrode TE3. The first opening OP1 may penetrate the via layer VIA. The transistor electrode TE3 may be exposed through the first opening OP1. In one or more embodiments, the first opening OP1 may overlap with an emission area EMA when viewed on a plane.

In accordance with one or more embodiments, an organic layer OL may be entirely provided and/or formed on the via layer VIA. The organic layer OL may be located on the via layer VIA to form a flat surface FS. The organic layer OL may fill the first opening OP1 of the via layer VIA.

A first electrode ELT1 may be located on the organic layer OL. The first electrode ELT1 may be located on the flat surface FS of the organic layer OL. That is, the first electrode ELT1 may be located on the organic layer OL in a substantially horizontal state in which any height difference for each position does not exist. The first electrode ELT1 may not be in direct contact with the via layer VIA and the transistor electrode TE3. In one or more embodiments, the first electrode ELT1 is not located in the first opening OP1 of the via layer VIA, so that any step difference is not formed in the first electrode ELT1.

The first electrode ELT1 may be located in the emission area EMA. In one or more embodiments, the first electrode ELT1 may overlap with the first opening OP1 of the via layer VIA when viewed on a plane.

The organic layer OL may include an organic material, and the organic material may have a conductive or non-conductive characteristic through insulation processing. The organic material may include poly(3,4-ethylenedioxythiophene):poly(styrenesulfonate) (PEDOT:PSS).

The organic layer OL may include a first area OLA1 and a second area OLA2. The first area OLA1 may be one area of the organic layer OL, which corresponds to the emission area EMA. The second area OLA2 may be one area of the organic layer OL, which corresponds to a non-emission area NEA.

The first area OLA1 may include a conductive organic layer, and the second area OLA2 may include a non-conductive organic layer.

The first electrode ELT1 may be electrically connected to the transistor electrode TE3 through the first area OLA1. The second area OLA2 may reduce or prevent the likelihood of electrical influence formed between the transistor electrode TE3 and the first electrode ELT1 of the sub-pixel SPX being transferred to components of adjacent sub-pixels and/or adjacent pixel circuits.

The first and second areas OLA1 and OLA2 of the organic layer OL may be formed through the same process.

The pixel-defining layer PDL may be located on the first electrode ELT1 and the organic layer OL. The pixel-defining layer PDL may define (or partition) the emission area EMA. The pixel-defining layer PDL may be an organic insulating layer made of an organic material. In one or more embodiments, the pixel-defining layer PDL may include a light absorption material, or may have a light absorber coated thereon, to absorb light introduced from the outside. For example, the pixel-defining layer PDL may include a carbon-based black pigment. However, the present disclosure is not limited thereto.

The pixel-defining layer PDL may be partially opened to include a second opening OP2 exposing one area of the first electrode ELT1. Therefore, the pixel-defining layer PDL may protrude in a third direction DR3 from the organic layer OL along the circumference of the emission area EMA. The emission area EMA may correspond to the second opening OP2 defined by the pixel-defining layer PDL. The non-emission area NEA may be an area substantially corresponding to the pixel-defining layer PDL.

The pixel-defining layer PDL may be located on the organic layer OL to define an area in which an emission layer EL is in contact with the first electrode ELT1. The emission layer EL may be located on the first electrode ELT1 exposed by the second opening OP2 of the pixel-defining layer PDL.

The emission layer EL may have a surface profile corresponding to the shape of the first electrode ELT1. That is, the emission layer EL may have a flat surface profile according to the flat shape of the first electrode ELT1 located on the flat surface FS. A height (or thickness) of the emission layer EL in the emission area EMA may be substantially constant regardless of the position at which the emission layer EL is located. Thus, as the first electrode ELT1 is located on the organic layer OL forming the flat surface FS, the emission layer EL located on the first electrode ELT1 is also located flat, so that any step difference according to the position of the emission layer EL does not occur. Accordingly, deterioration of the light emission efficiency of the light-emitting element LD due to a height difference for each position of the emission layer EL can be reduced or minimized.

A second electrode ELT2 may be located over the emission layer EL and the pixel-defining layer PDL. The second electrode ELT2 may be provided in a plate shape throughout the entire area of the sub-pixel SPX.

Figure 7:
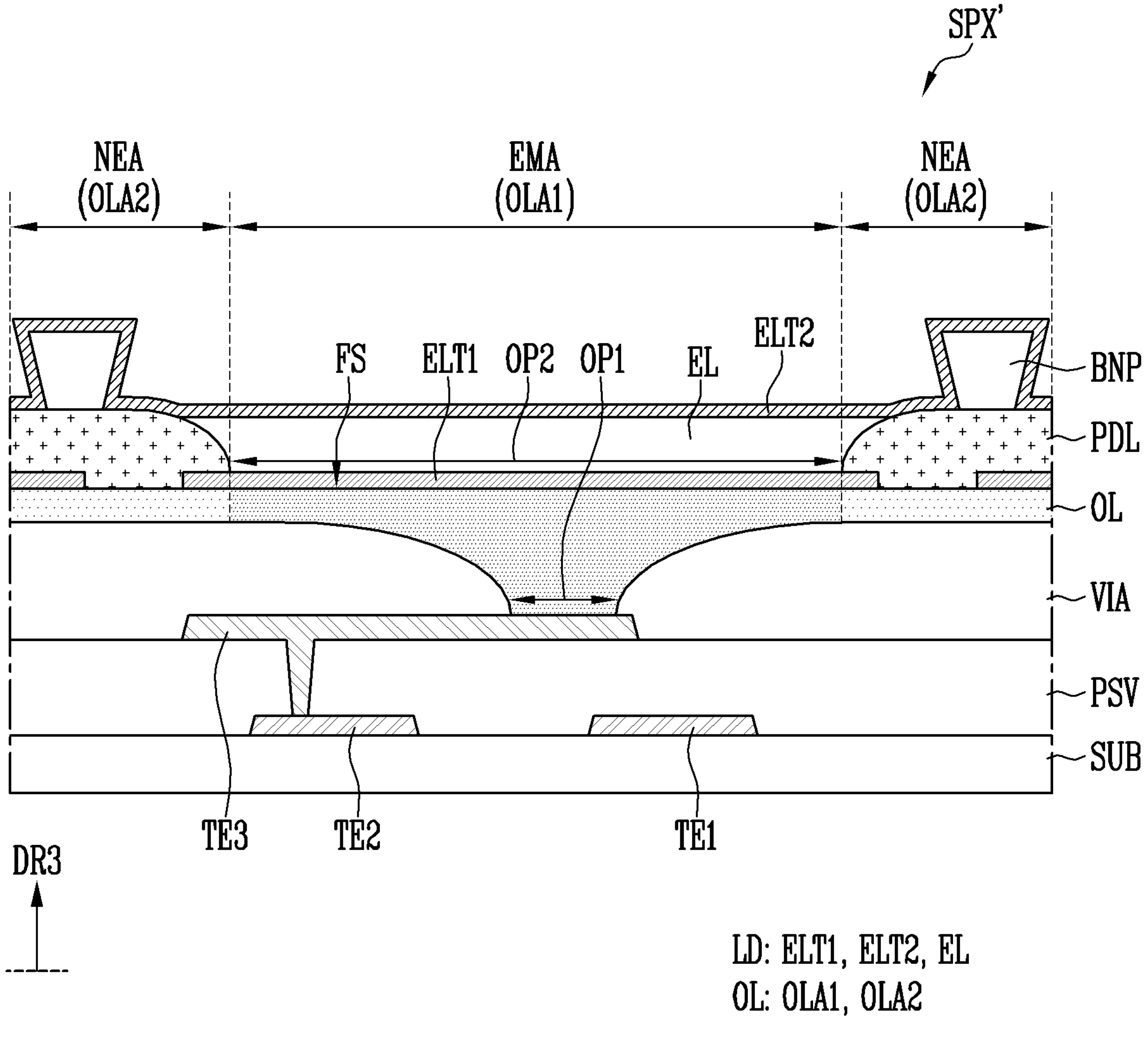
FIG. 7 is a schematic sectional view illustrating one or more other embodiments of the sub-pixel included in the display device shown in FIG. 1.

FIG. 7 is a schematic sectional view illustrating one or more other embodiments of the sub-pixel included in the display device shown in FIG. 1.

Referring to FIG. 7, the other components except a bank pattern BNP are identical to or correspond to the components shown in FIG. 6, and therefore, overlapping descriptions will be omitted.

A sub-pixel SPX' may further include a bank pattern BNP. The bank pattern BNP may have a dam structure shape located on a pixel-defining layer PDL. The bank pattern BNP may be located on the pixel-defining layer PDL to reduce or prevent the likelihood of an emission layer EL overflowing into an adjacent sub-pixel SPX, thereby guiding the emission layer EL to be normally located in an emission area EMA of the corresponding sub-pixel SPX'. A second electrode ELT2 may be located over the emission layer EL, the pixel-defining layer PDL, and the bank pattern BNP.

Figure 8:
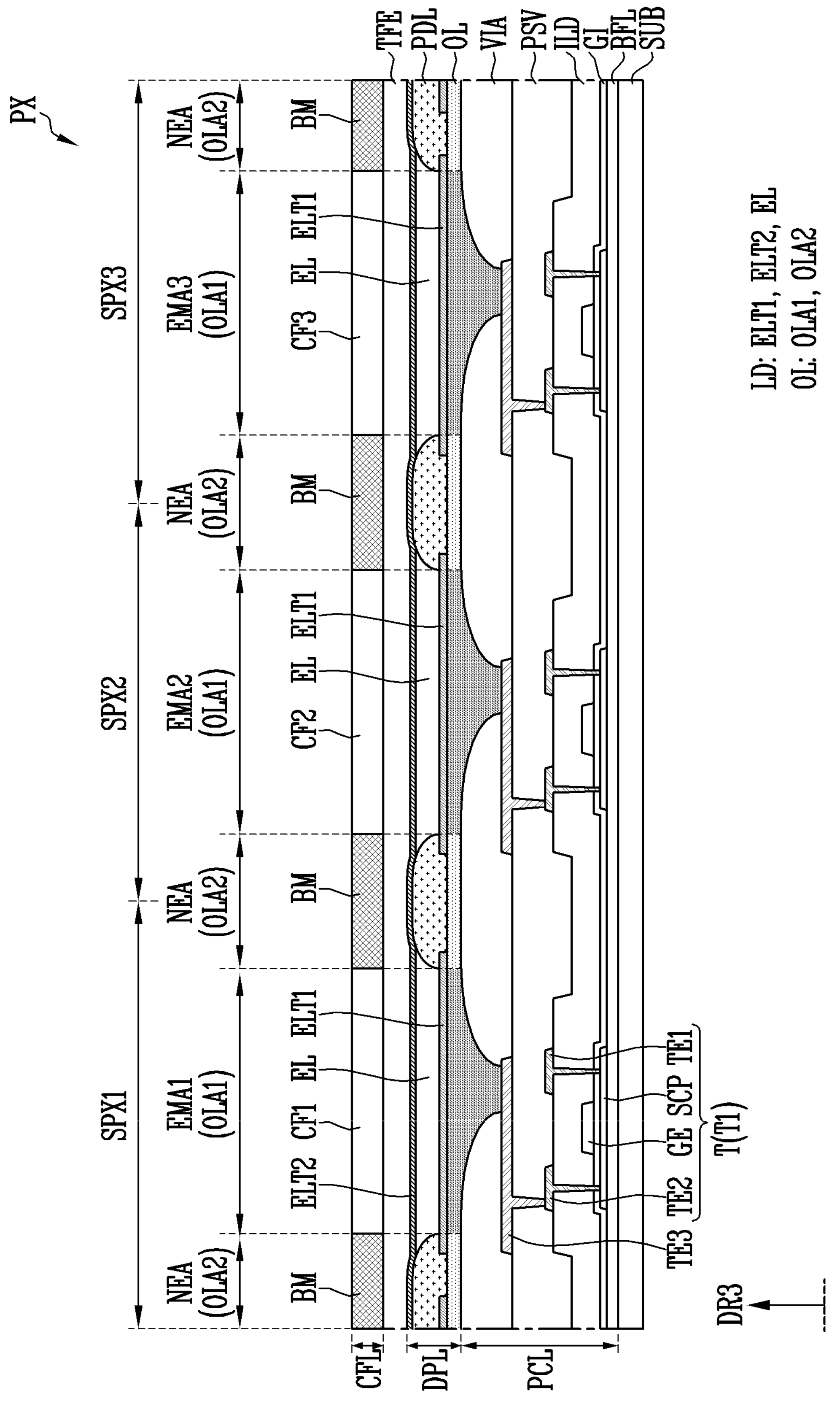
FIG. 8 is a schematic sectional view illustrating one or more embodiments of the pixel included in the display device shown in FIG. 1.

FIG. 8 is a schematic sectional view illustrating one or more embodiments of the pixel included in the display device shown in FIG. 1.

Referring to FIG. 8, a pixel PX may include a substrate SUB, and a pixel circuit layer PCL, a display element layer DPL, an encapsulation layer TFE, and a color filter layer CFL, which are sequentially located on the substrate SUB.

Each of first to third sub-pixels SPX1 to SPX3 may include first to third emission areas EMA1 to EMA3, and a non-emission area NEA may be located between the first to third emission areas EMA1 to EMA3.

The pixel circuit layer PCL may be provided on one surface of the substrate SUB. The pixel circuit layer PCL may include circuit elements constituting each of the first to third sub-pixels SPX1 to SPX3. For example, transistors T and a capacitor, which constitute each of the first to third sub-pixels SPX1 to SPX3 of the pixel circuit layer PCL, may be formed in the corresponding sub-pixel.

In FIG. 8, any one transistor T (e.g., a first transistor T1) connected to each light-emitting element LD will be illustrated as an example of circuit elements that can be provided in the pixel circuit layer PCL of the first to third sub-pixels SPX1 to SPX3.

The pixel circuit layer PCL may include various signal lines, power lines, and/or pads, which are connected to the first to third sub-pixels SPX1 to SPX3. The pixel circuit layer PCL may include a plurality of conductive layers constituting various signal lines, power lines, and/or pads. The pixel circuit layer PCL may further include a plurality of insulating layers respectively located between the conductive layers.

The buffer layer BFL may be located on the substrate SUB. The buffer layer BFL may reduce or prevent an impurity being diffused into a circuit element. The buffer layer BFL may be configured as a single layer, or also may be configured as a multi-layer including at least two layers. When the buffer layer BFL is formed as the multi-layer, the layers may be formed of the same material or may be formed of different materials.

A semiconductor pattern SCP may be located on the buffer layer BFL. In one or more embodiments, the semiconductor pattern SCP may include a first region in contact with a first terminal TE1, a second region in contact with a second terminal TE2, and a channel region located between the first and second regions. In some embodiments, one of the first and second regions may be a source region, and the other of the first and second regions may be a drain region.

In some embodiments, the semiconductor pattern SCP may be made of poly-silicon, amorphous silicon, oxide semiconductor, etc. In addition, the channel region of the semiconductor pattern SCP is a semiconductor pattern undoped with an impurity, and may be an intrinsic semiconductor. Each of the first and second regions of the semiconductor pattern SCP may be a semiconductor pattern doped with an impurity.

A gate-insulating layer GI may be located on the buffer layer BFL and the semiconductor pattern SCP. In one or more embodiments, the gate-insulating layer GI may be located between the semiconductor pattern SCP and a gate electrode GE. The gate-insulating layer GI may be configured as a single layer or as a multi-layer, and may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and/or titanium oxide ($TiO_x$).

The gate electrode GE may be located on the gate-insulating layer GI. The gate electrode GE may be located on the gate-insulating layer GI to overlap with the semiconductor pattern SCP in the third direction DR3.

An interlayer insulating layer ILD may be located on the gate-insulating layer GI. In one or more embodiments, the interlayer insulating layer ILD may be located between the gate electrode GE and the first and second terminals TE1 and TE2. The interlayer insulating layer ILD may be configured as a single layer or a multi-layer, and include the above-described inorganic material.

The first and second terminals TE1 and TE2 may be located on the interlayer insulating layer ILD. The first and second terminals TE1 and TE2 may be located to overlap with the semiconductor pattern SCP in the third direction DR3. The first and second terminals TE1 and TE2 may be electrically connected to the semiconductor pattern SCP. For example, the first terminal TE1 may be electrically connected to the first region of the semiconductor pattern SCP through a contact hole penetrating the interlayer insulating layer ILD and/or the gate-insulating layer GI. The second terminal TE2 may be electrically connected to the second region of the semiconductor pattern SCP through a contact hole penetrating the interlayer insulating layer ILD and/or the gate-insulating layer GI. In some embodiments, any one of the first or second terminals TE1 and TE2 may be a source electrode, and the other of the first or second terminals TE1 and TE2 may be a drain electrode.

The first and second terminals TE1 and TE2 may be formed as a single layer or a multi-layer, which is made of at least one of aluminum (Al), molybdenum (Mo), chromium (Cr), gold (Au), titanium (Ti), nickel (Ni), neodymium (Nd), and/or indium tin oxide (ITO), or any alloy thereof.

A protective layer PSV may be located over the first and second terminals TE1 and TE2. The protective layer PSV may be configured as a single layer or a multi-layer. In one or more embodiments, the protective layer PSV may include an organic material, such as acrylic resin, epoxy resin, phenolic resin, polyamides resin, polyimides resin, polyester resin, poly-phenylene sulfide resin, or benzocyclobutene (BCB). However, the present disclosure is not necessarily limited thereto, and the protective layer PSV may include the above-described inorganic material.

A transistor electrode TE3 may be located on the protective layer PSV. The transistor electrode TE3 may allow the transistor T and a first electrode ELT1 provided in a light-emitting unit EMU of each of the first to third sub-pixels SPX1 to SPX3 to be electrically connected to each other therethrough. For example, the transistor electrode TE3 may be electrically connected to the first terminal TE1 of the transistor T through a contact hole penetrating the protective layer PSV.

The transistor electrode TE3 may be formed as a single layer or a multi-layer, which is made of at least one of aluminum (Al), molybdenum (Mo), chromium (Cr), gold (Au), titanium (Ti), nickel (Ni), neodymium (Nd), and/or indium tin oxide (ITO), or any alloy thereof.

A via layer VIA may be located on the protective layer PSV. The via layer VIA may include an opening (e.g., the first opening OP1) exposing the transistor electrode TE3 to the outside.

The display element layer DPL may be located on the via layer VIA. The display element layer DPL may include an organic layer OL, a pixel-defining layer PDL, and a light-emitting element LD including a first electrode ELT1, an emission layer EL, and a second electrode ELT2.

The organic layer OL may be located on the pixel circuit layer PCL, and may include an organic material for planarizing a step difference formed on the via layer VIA. The organic layer OL may include a first area OLA1 corresponding to the first to third emission areas EMA1 to EMA3, and a second area OLA2 corresponding to the non-emission area NEA. The first area OLA1 may have a conductive characteristic, and the second area OLA2 may have a non-conductive characteristic through insulation processing. That is, the second area OLA2 of the organic layer OL may reduce, prevent, or minimize an electrical signal between a transistor electrode TE3 and a first electrode ELT1 in a corresponding sub-pixel SPX from being transferred to an adjacent sub-pixel SPX.

The pixel-defining layer PDL may be located on the organic layer OL to define a position at which an emission layer EL is arranged. The pixel-defining layer PDL may be located on an exposed surface of the first electrode ELT1. At least a portion of the first electrode ELT1 may be exposed through an area defined by the pixel-defining layer PDL.

The pixel-defining layer PDL may include an organic material. In some embodiments, the pixel-defining layer PDL may include at least one selected from the group consisting of acrylic resin, epoxy resin, phenolic resin, polyamide resin, and/or polyimide resin. However, the present disclosure is not limited thereto.

In some embodiments, the emission layer EL may be located in the area defined by the pixel-defining layer PDL. One surface of the emission layer EL may be electrically connected to the first electrode ELT1, and the other surface of the emission layer EL may be electrically connected to the second electrode ELT2. A height (or thickness) of the emission layer EL may be substantially constant regardless of the position at which the emission layer EL is located. Thus, as the first electrode ELT1 is located on the organic layer OL forming the flat surface FS, the emission layer EL located on the first electrode ELT1 is also located flat, so that any step difference according to the position of the emission layer EL does not occur, or occurs minimally. Accordingly, deterioration of the light emission efficiency of the light-emitting element LD due to a height difference for each position of the emission layer EL can be reduced or minimized.

The second electrode ELT2 may be located over the emission layer EL. The second electrode ELT2 may entirely cover the pixel-defining layer PDL and the emission layer EL. The second electrode ELT2 may be provided in a plate shape throughout the entire area of the first to third sub-pixels SPX1 to SPX3. However, the present disclosure is not limited thereto. For example, the second electrode ELT2 covers the emission layer EL, and may be located to cover only a portion of the pixel-defining layer PDL.

The second electrode ELT2 may be a thin film metal layer having a thickness enough to allow light emitted from each emission layer EL to be transmitted therethrough. The second electrode ELT2 may be formed of a metal material to have a relatively thin thickness, or may be configured with a transparent conductive material. The second electrode ELT2 may include at least one of various transparent conductive materials including indium tin oxide, indium zinc oxide, indium tin zinc oxide, aluminum zinc oxide, gallium zinc oxide, zinc tin oxide, and/or gallium tin oxide, and may be formed substantially transparent or translucent. Accordingly, light emitted from the emission layer EL located on the bottom of the second electrode ELT2 may be emitted in a upper direction of the encapsulation layer TFE while passing through the second electrode ELT2.

The encapsulation layer TFE may be entirely provided and/or formed over the second electrode ELT2.

The encapsulation layer TFE may be located over the second electrode ELT2. The encapsulation layer TFE may be a multi-layer in which an inorganic layer and an organic layer are alternately located.

The color filter layer CFL may be located on the encapsulation layer TFE. The color filter layer CFL may be located on a path through which light generated from light-emitting elements LD is emitted.

A first color filter CF1 may be located above a light-emitting element LD of the first sub-pixel SPX1, and may allow light of a first color to be selectively transmitted therethrough. For example, the first color filter CF1 may include a color filter material of the first color, which allows light of the first color to be transmitted therethrough, and which reduces or blocks transmission of lights of a second color and a third color.

A second color filter CF2 may be located above a light-emitting element LD of the second sub-pixel SPX2, and may allow light of the second color to be selectively transmitted therethrough. For example, the second color filter CF2 may include a color filter material of the second color, which allows light of the second color to be transmitted therethrough, and which reduces or blocks transmission of lights of the first color and the third color.

A third color filter CF3 may be located above a light-emitting element LD of the third sub-pixel SPX3, and may allow light of the third color to be selectively transmitted therethrough. For example, the third color filter CF3 may include a color filter material of the third color, which allows light of the third color to be transmitted therethrough, and which reduces or blocks transmission of lights of the first color and the second color.

A light-blocking pattern BM may surround the first to third emission areas EMA1 to EMA3. The light-blocking pattern BM may include openings overlapping with the first to third emission areas EMA1 to EMA3. The openings of the light-blocking pattern BM may respectively be the first to third emission areas EMA1 to EMA3.

The first color filter CF1 may be located to overlap with the first emission area EMA1 of the first sub-pixel SPX1. For example, the first color filter CF1 may be located in an opening of the light-blocking pattern BM. The second color filter CF2 may be located to overlap with the second emission area EMA2 of the second sub-pixel SPX2. For example, the second color filter CF2 may be located in an opening of the light-blocking pattern BM. The third color filter CF3 may be located to overlap with the third emission area EMA3 of the third sub-pixel SPX3. For example, the third color filter CF3 may be located in an opening of the light-blocking pattern BM.

The light-blocking pattern BM may include at least one light-blocking material capable of blocking transmission of light and/or absorbing light. For example, the light-blocking pattern BM may include an organic material including at least one of graphite, carbon black, black pigment, and/or black dye, and at least one material among metals including chromium (Cr), or various other light-blocking materials.

In one or more embodiments, an optical layer (e.g., an optical part 20 shown in FIG. 18) may be located on the color filter layer CFL. The optical layer may include a pancake lens.

FIGS. 9 to 16 are schematic plan views illustrating a manufacturing method of a display device in accordance with embodiments of the present disclosure.

Referring to FIGS. 9 to 16, in the manufacturing method of the display device, a transistor electrode TE3 may be formed on a substrate SUB. A via layer VIA may be formed, which includes/defines a first opening OP1 exposing the transistor electrode TE3 (see FIG. 9). An organic layer OL forming a flat surface FS by filling the first opening OP1 may be formed on the via layer VIA (see FIG. 10). A first electrode ELT1 electrically connected to the transistor electrode TE3 may be formed on the organic layer OL (see FIG. 13). An emission layer EL may be formed on the first electrode ELT1, and a second electrode ELT2 may be formed over the emission layer EL (see FIG. 16).

Figure 9:
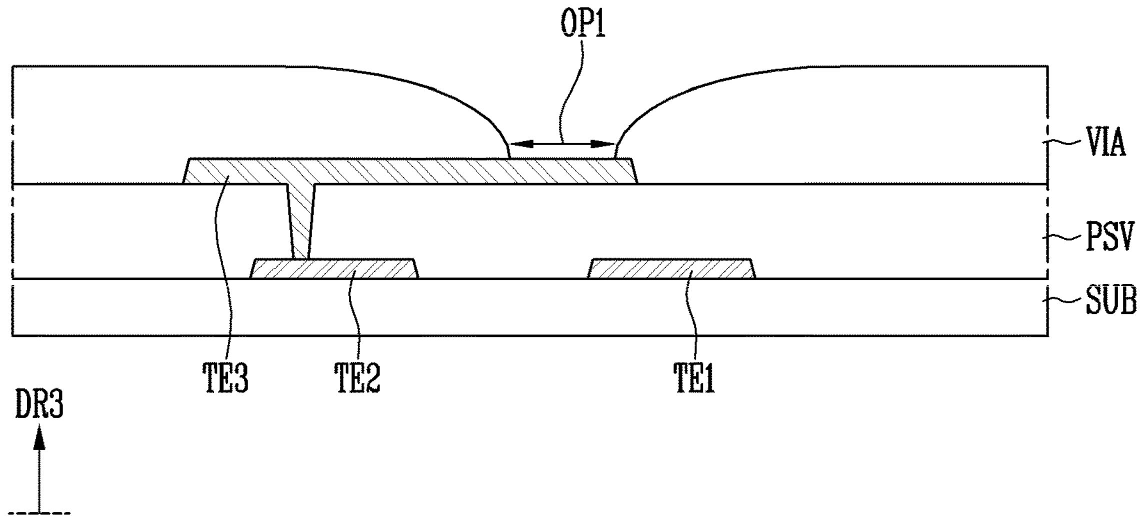
FIGS. 9 to 16 are schematic plan views illustrating a manufacturing method of a display device in accordance with embodiments of the present disclosure.

Referring to FIG. 9, a transistor electrode TE3 may be formed on a substrate SUB. In one or more embodiments, at least one circuit element and/or insulating layers may be located between the transistor electrode TE3 and the substrate SUB. For example, first and second terminals TE1 and TE2 of a transistor (e.g., the first transistor T1 shown in FIG. 8) may be formed on the substrate SUB. A protective layer PSV may be formed over the first and second terminals TE1 and TE2. The transistor electrode TE3 may be formed directly on the protective layer PSV. The transistor electrode TE3 may be electrically connected to the second terminal TE2 through a contact hole penetrating the protective layer PSV.

In one or more embodiments, a via layer VIA may be formed over the transistor electrode TE3. As one area of the via layer VIA overlapping with the transistor electrode TE3 on a plane is removed, a first opening OP1 may be formed.

The transistor electrode TE3 may be exposed through the first opening OP1 penetrating the via layer VIA.

Figure 10:
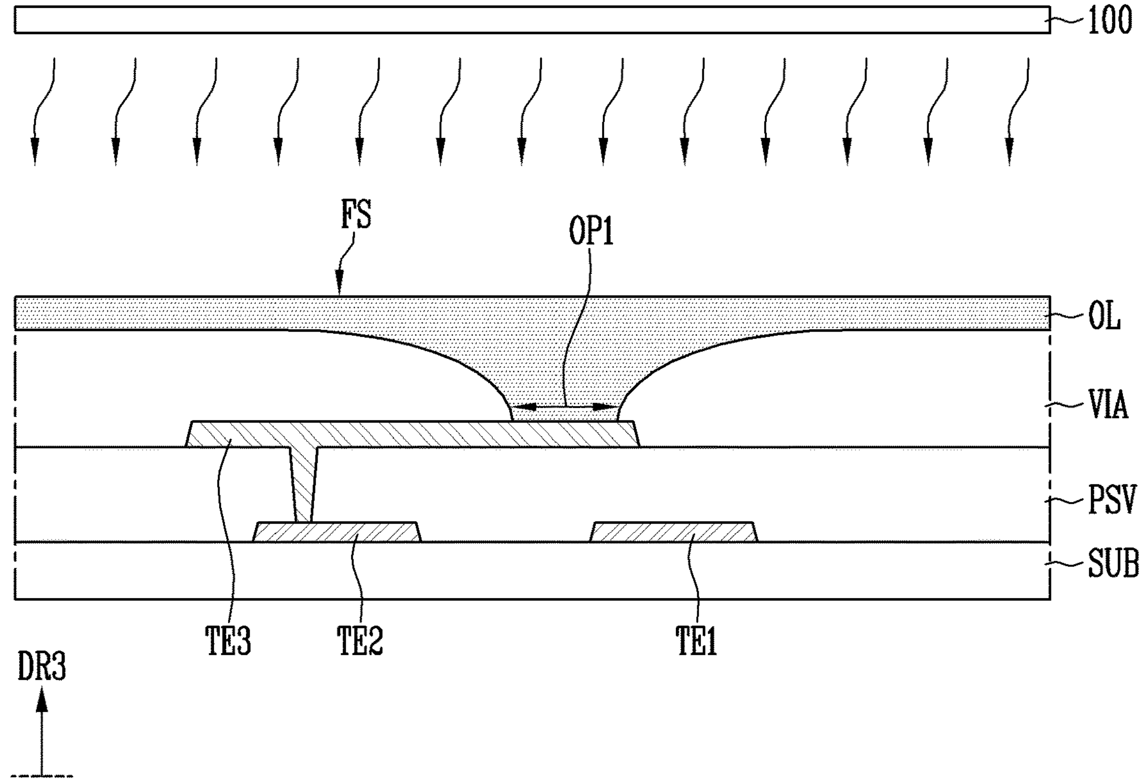

Referring to FIG. 10, an organic layer OL forming a flat surface FS by filling the first opening OP1 may be formed on the via layer VIA. The organic layer OL may be entirely applied on the via layer VIA. The organic layer OL may include a conductive organic material. For example, the conductive organic material may include poly(3,4-ethylenedioxythiophene):poly(styrenesulfonate) (PEDOT:PSS). The organic layer OL may form the flat surface on the via layer VIA.

In one or more embodiments, a heat treatment process may be performed on a surface of the organic layer OL located on the via layer VIA. The surface of the organic layer OL may be exposed to heat of about 200 °C by a heating device 100 located above the organic layer OL. In one or more embodiments, heat resistance of the organic layer OL on which the heat treatment process is performed may increase. For example, the sheet resistance of the organic layer OL may increase by about 20% according to the heat treatment process.

Figure 11:
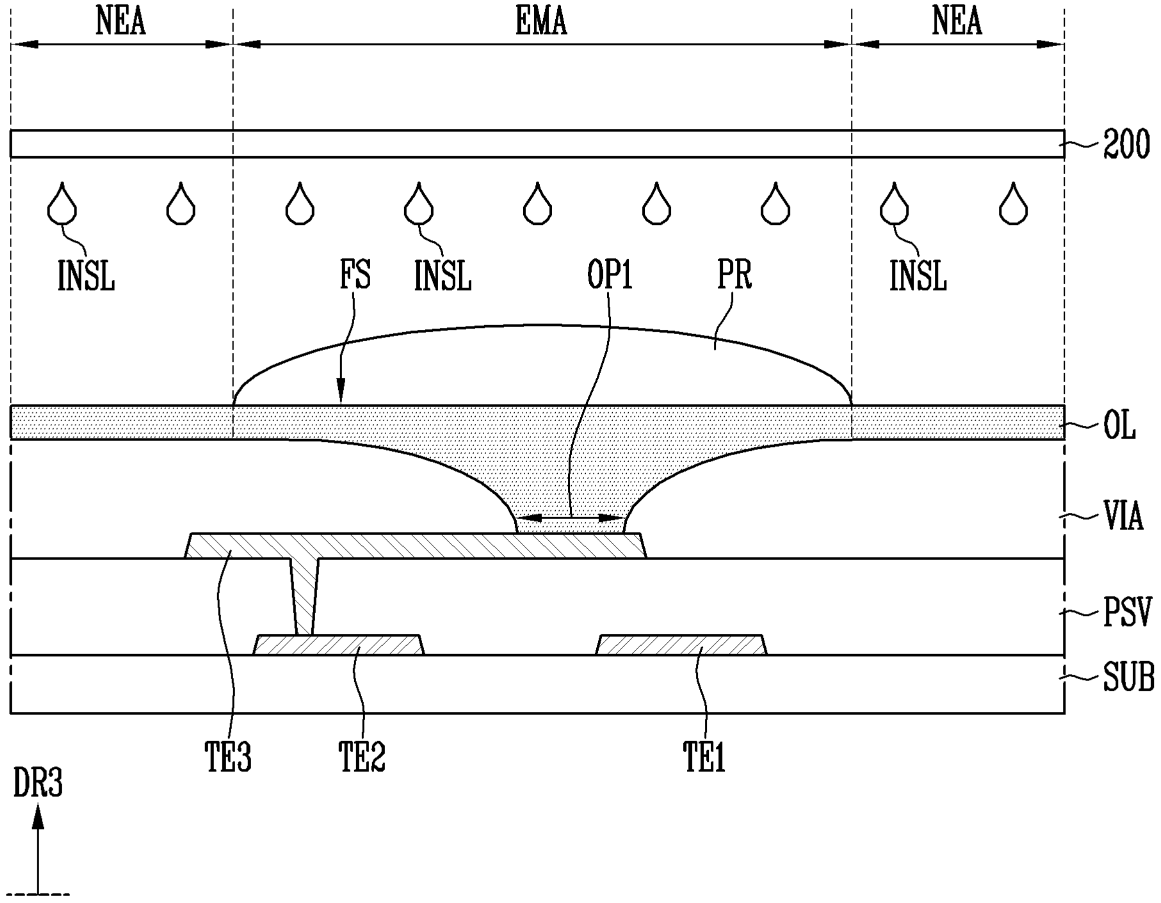

Referring to FIG. 11, a process of patterning a photoresist pattern PR on a first area OLA1 of the organic layer OL, which corresponds to an emission area EMA, (hereinafter, referred to as a patterning process) may be performed. After the patterning process is performed, a process of spraying an insulation solution INSL onto the organic layer OL (hereinafter, referred to as an insulation process) may be performed.

In one or more embodiments, the first area OLA1 of the organic layer OL may be an area overlapping with the first opening OP1 when viewed on a plane. The first area OLA1 is an area having conductivity, and may be electrically connected to the transistor electrode TE3. In one or more embodiments, the photoresist pattern PR may be patterned on the first area OLA1 so as to perform the insulation process on only a second area OLA2 of the organic layer OL.

In one or more embodiments, the photoresist pattern PR may not be patterned on the second area OLA2 of the organic layer OL, which corresponds to a non-emission area NEA. As the insulation solution INSL is sprayed onto the organic layer OL by using the photoresist pattern PR as a mask, the second area OLA2 of the organic layer OL may be exposed to the insulation solution INSL. Conductive polymers may be insulated by the insulation solution INSL while reacting with the insulation solution INSL.

Figure 12:
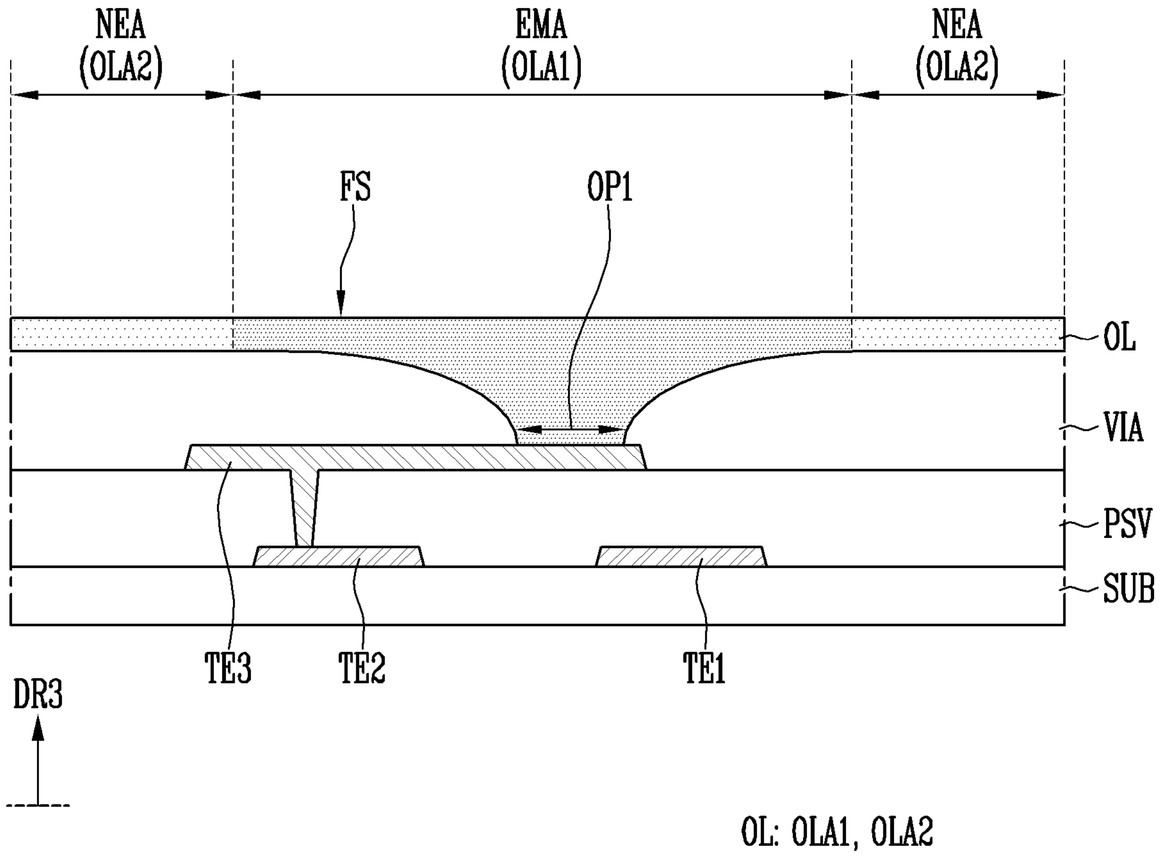

Referring to FIG. 12, after the insulation process is performed, the photoresist pattern PR located on the first area OLA1 of the organic layer OL may be removed. The first area OLA1 of the organic layer OL may have a conductive characteristic, and the second area OLA2 of the organic layer OL may have a non-conductive characteristic due to the insulation process. As the second area OLA2 surrounding the first area OLA1 of the organic layer OL has the non-conductive characteristic, an influence of an electrical signal between the first area OLA1 of the organic layer OL and the transistor electrode TE3 on an adjacent sub-pixel or other pixel components can be reduced or prevented.

Figure 13:
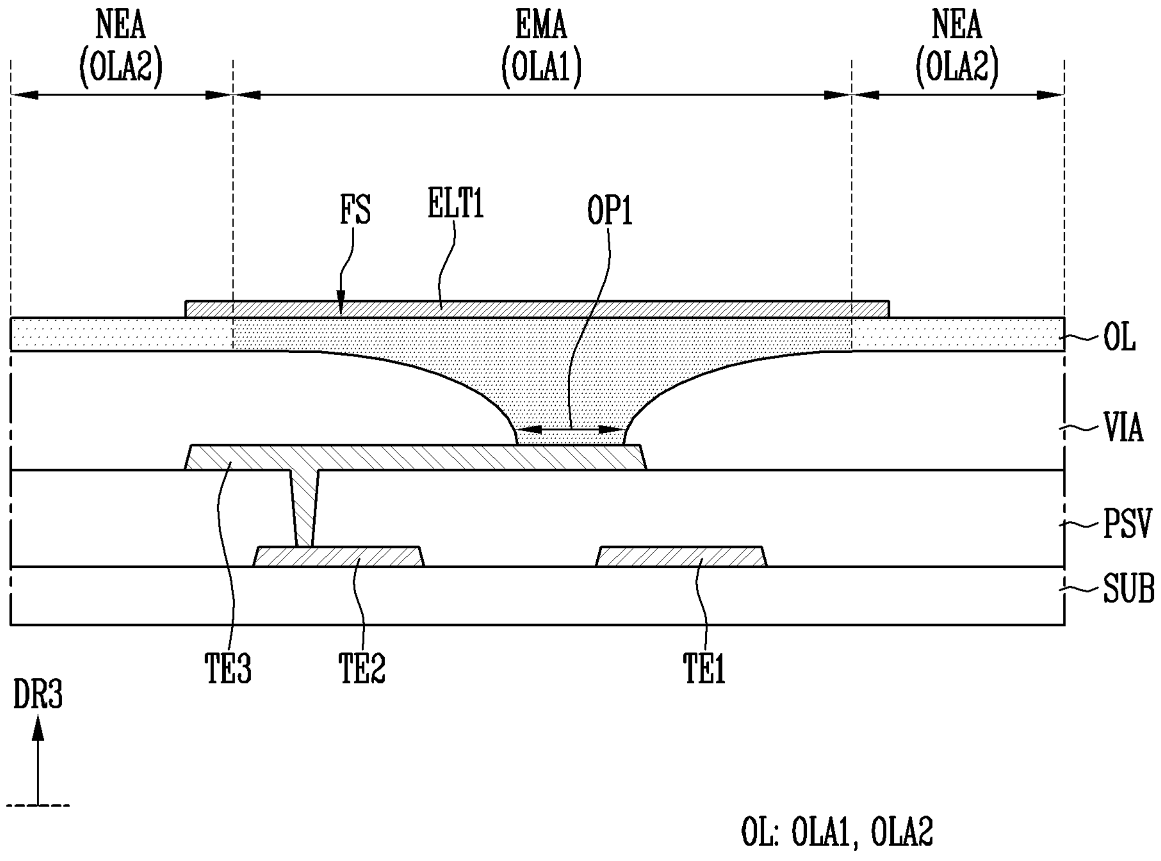

Referring to FIG. 13, a first electrode ELT1 electrically connected to the transistor electrode TE3 may be formed on the organic layer OL.

In one or more embodiments, the first electrode ELT1 may be located to cover the first area OLA1 of the organic layer OL when viewed on a plane. The first electrode ELT1 may be electrically connected to the transistor electrode TE3 through the first area OLA1 of the organic layer OL. In one or more embodiments, both ends of the first electrode ELT1 may overlap with the second area OLA2 of the organic layer OL when viewed on a plane.

In one or more embodiments, the first electrode ELT1 may be formed on the flat surface FS of the organic layer OL. Any step difference (e.g., a height difference according to a position) is not formed, or is minimally formed, in the first electrode ELT1 located on the flat surface FS of the organic layer OL, and thus, occurrence of disconnection of the first electrode ELT1 can be reduced or minimized. Accordingly, the first electrode ELT1 can be stably electrically connected to the transistor electrode TE3 through the first area OLA1 of the organic layer OL.

Figure 14:
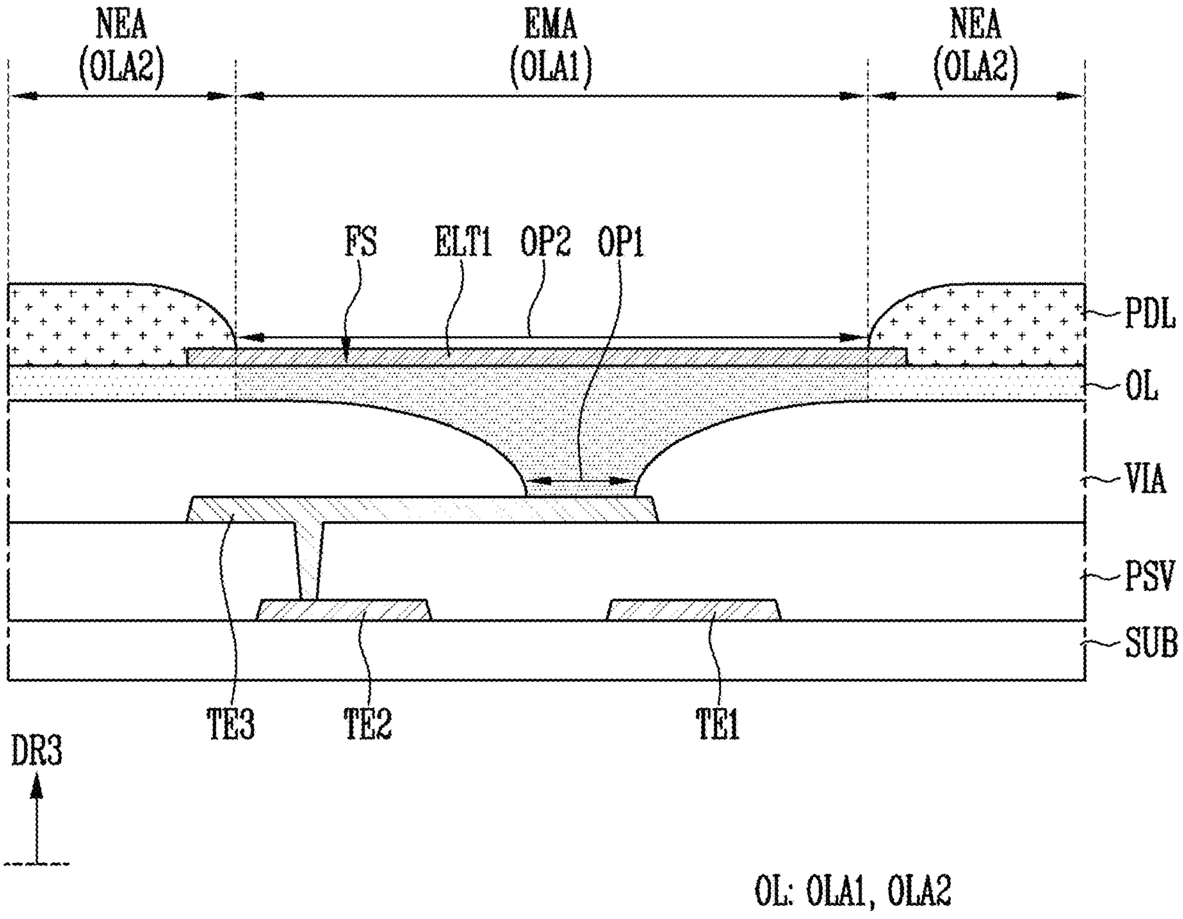

Referring to FIG. 14, a pixel-defining layer PDL may be formed on the first electrode ELT1 and the organic layer OL. The pixel-defining layer PDL may include a second opening OP2 exposing one area of the first electrode ELT1. The pixel-defining layer PDL may define the emission area EMA. That is, the pixel-defining layer PDL may define an area in which an emission layer, which will be described later, is located.

Figure 15:
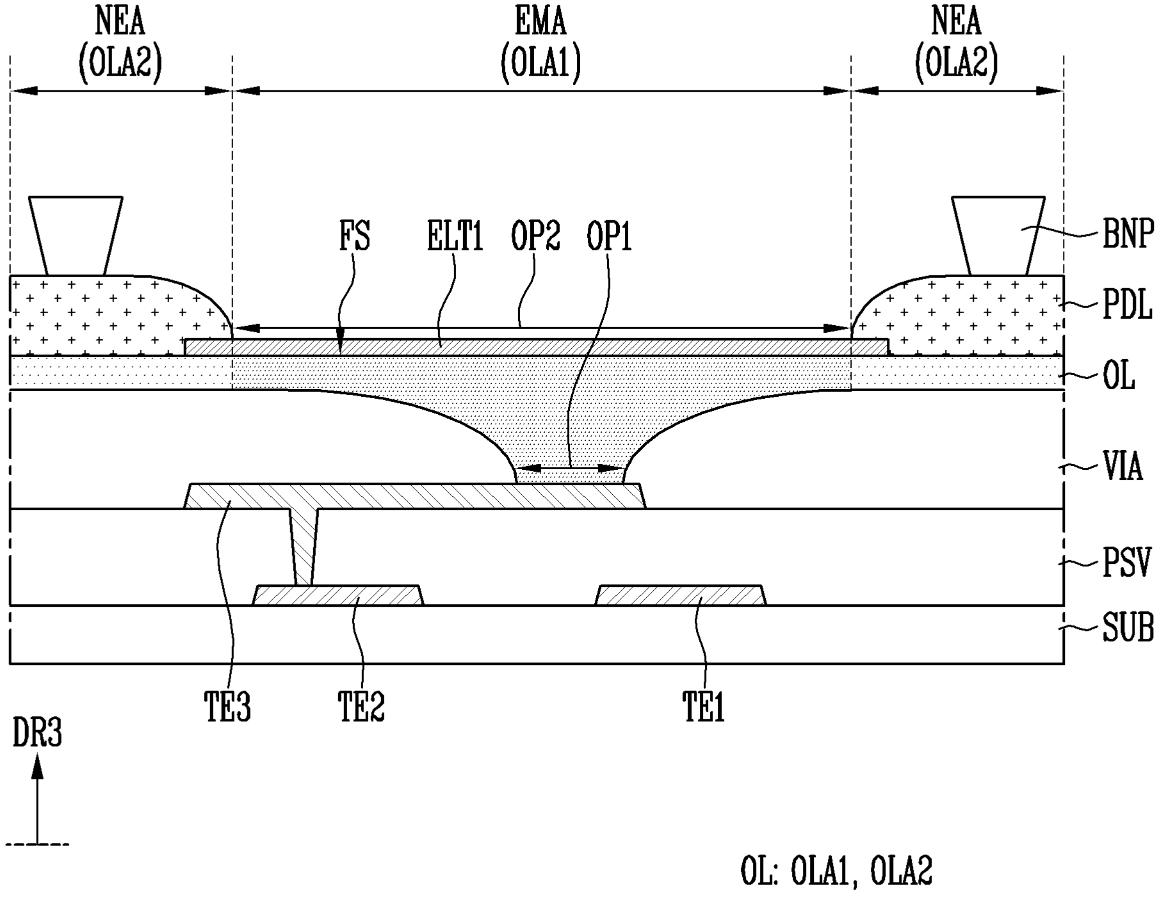

Referring to FIG. 15, a bank pattern BNP may be formed on the pixel-defining layer PDL. The bank pattern BNP may be a dam structure for reducing or preventing the likelihood of the emission layer EL, which will be described later, flowing into an adjacent sub-pixel. The bank pattern BNP may be omitted in one or more other embodiments according to a process condition.

Figure 16:
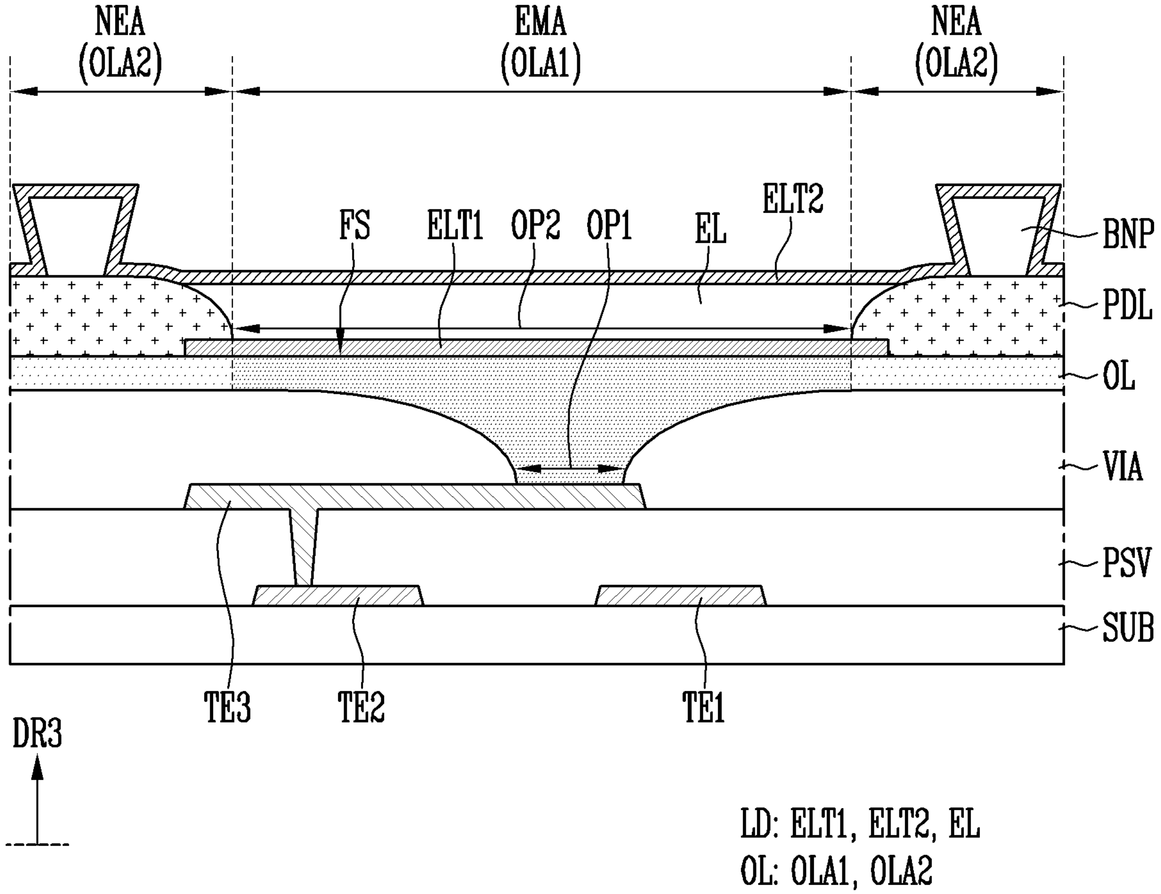

Referring to FIG. 16, the emission layer EL and a second electrode ELT2 may be sequentially formed in the third direction DR3 on the first electrode ELT1.

In one or more embodiments, the emission layer EL may be formed in an area corresponding to the emission area EMA defined by the pixel-defining layer PDL. The emission layer EL may be formed directly on the first electrode ELT1 exposed by the second opening OP2 of the pixel-defining layer PDL.

In one or more embodiments, the emission layer EL may have a surface profile corresponding to the shape of the first electrode ELT1. That is, the emission layer EL may have a flat surface profile according to the flat shape of the first electrode ELT1 located on the flat surface FS. A height (or thickness) of the emission layer EL may be substantially constant regardless of the position at which the emission layer EL is located. Thus, deterioration of the light emission efficiency of a light-emitting element LD due to a height difference for each position of the emission layer EL can be reduced or minimized.

In one or more embodiments, the second electrode ELT2 may be formed on the emission layer EL, the pixel-defining layer PDL, and the bank pattern BNP. The second electrode ELT2 may be provided in a plate shape throughout the entire area of a sub-pixel.

Figure 17:
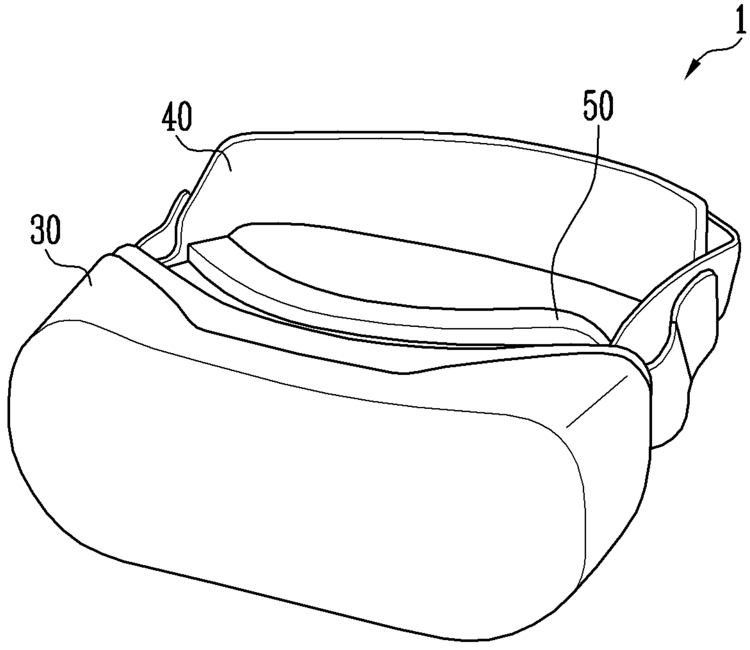
FIG. 17 illustrates one or more embodiments of an electronic device including the display device shown in FIG. 1.
Figure 18:
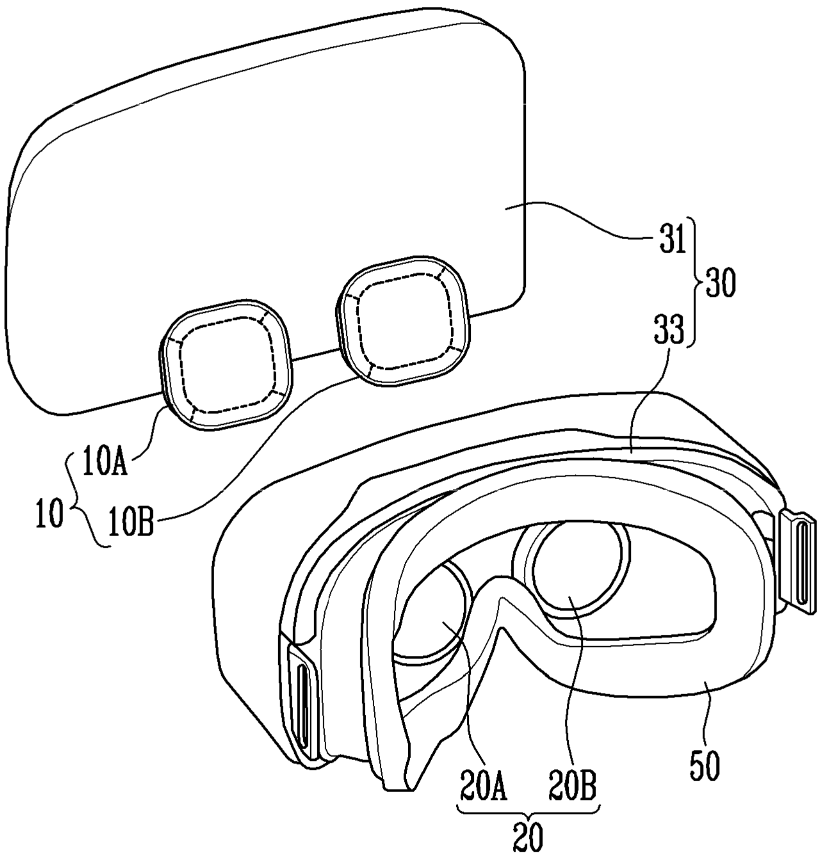
FIG. 18 illustrates an exploded view of the electronic device shown in FIG. 17.

FIG. 17 illustrates one or more embodiments of an electronic device including the display device shown in FIG. 1. FIG. 18 illustrates an exploded view of the electronic device shown in FIG. 17.

Referring to FIGS. 17 and 18, an electronic device 1 may include a head mounted display device worn on a head of a user to provide the user with a screen on which an image or a picture is displayed.

The electronic device 1 may include a see-through type of which augmented reality is provided based on real external objects, and a see-closed type of which virtual reality is provided to the user through a screen independent from an external object. Hereinafter, a see-closed type head mounted display device is shown, but the present disclosure is not limited thereto.

Referring to FIGS. 17 and 18, the electronic device 1 may include a display part 10, an optical part 20, a case part 30, a fixing part 40, and a cushion part 50.

In one or more embodiments, the display part 10 (e.g., the display device DD shown in FIG. 1) may provide an image. The display part 10 may emit light, thereby providing an image and/or a picture. The display part 10 may be accommodated in the case part 30. The display part 10 may be configured opaque, transparent or translucent according to a type of the electronic device 1. The display part 10 may include a display panel for displaying an image or a picture. In one or more embodiments, the display part 10 may include a light-emitting display panel including a light-emitting element. For example, the display part 10 may include an organic light-emitting display panel using an organic light-emitting diode including an organic emission layer, a micro light-emitting diode (LED) display panel using a micro LED, a quantum dot light-emitting display panel using a quantum dot light-emitting diode including a quantum dot emission layer, or an inorganic light-emitting display panel using an inorganic light-emitting diode including an inorganic semiconductor.

The display part 10 may include a first display part 10A and a second display part 10B. The first display part 10A may be located to face a left eye of the user, and the second display part 10B may be located to face a right eye of the user.

The display part 10 may include a first surface (or front surface) from which light is emitted, and a second surface (or rear surface), which is opposite to the first surface.

When the pixel (e.g., the sub-pixel SPX shown in FIG. 6) is applied to the electronic device 1, the electronic device 1 is relatively small, but may have a small pixel pitch and a high pixel count to output high-resolution contents.

The optical part 20 may allow light emitted from the display part 10 to pass therethrough. The optical part 20 may refract and/or reflect light emitted from the display part 10. In one or more embodiments, the optical part 20 may enlarge an image provided from the display part 10. The optical part 20 may be located while facing the display part 10. When the user wears the electronic device 1, the optical part 20 may be located between the user and the display part 10. Thus, the user can recognize light that is emitted from the display part 10 and is refracted and/or reflected by the optical part 20.

The optical part 20 may include a first optical part 20A and a second optical part 20B. The first optical part 20A may be located to face the left eye of the user, and may overlap with the first display part 10A. The second optical part 20B may be located to face the right eye of the user, and may overlap with the second display part 10B. The optical part 20 may include pancake lenses. The optical part 20 having a plate shape, such as the pancake lens, may be applied to achieve miniaturization of the electronic device 1.

The case part 30 may accommodate the display part 10 and the optical part 20. The case part 30 may have a space therein, and the display part 10 and the optical part 20 may be located in the space. The case part 30 may protect the display part 10 and the optical part 20 from external impact.

The case part 30 may include a cover part 31 and a body part 33. The case part 30 may be divided into the cover part 31 and the body part 33. However, the present disclosure is not limited thereto, and the cover part 31 and the body part 33 may be integrally formed. In one or more embodiments, the cover part 31 may be located on the rear surface of the display part 10, and the body part 33 may be located on the front surface of the display part 10.

The fixing part 40 may allow the case part 30 to be mounted on the head of the user. The length of the fixing part 40 may be adjusted according to the circumference of the head of the user. The fixing part 40 may include a structure, such as a strap or a band, which is connected to the case part 30. The fixing part 40 may be detachably attached to the case part 30.

The cushion part 50 may improve wearing sensation of the user. When the user wears the electronic device 1, the cushion part 50 may be located between the user and the case part 30. In one or more embodiments, the cushion part 50 may be attached to the case part 30. In one or more embodiments, the cushion part 50 may be detached from the case part 30, and may be omitted in the electronic device 1.

The electronic device 1 may further include a controller. The controller may perform calculation of a relative pupil position of the user, calculation of a gaze direction of the user, image processing (e.g., image mapping) based on the calculated pupil position (or the gate direction) of the user, and an operation for image display processed in the display part 10.

The controller may be implemented as a dedicated processor including an embedded processor or the like, and/or a general-purpose processor including a central processing unit, an application process, or the like. However, the present disclosure is not limited thereto.

In accordance with the present disclosure, the display device includes a first electrode, an emission layer, and a second electrode, which are sequentially located on an organic layer forming a flat surface on a via layer, so that deterioration of the light emission efficiency due to a height difference of the emission layer can be reduced or prevented.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, with functional equivalents thereof to be included therein.

What is claimed is:

1. A display device comprising:

a substrate comprising an emission area and a non-emission area;

a transistor electrode above the substrate;

a via layer over the transistor electrode, and defining a first opening exposing the transistor electrode;

an organic layer above the via layer to fill the first opening;

a first electrode above the organic layer, and electrically connected to the transistor electrode through the organic layer;

an emission layer above the first electrode; and a second electrode over the emission layer, wherein the organic layer comprises a first area overlapping the emission area, and a second area overlapping the non-emission area, wherein the first area comprises a conductive organic layer, and wherein the second area comprises a non-conductive organic layer.

2. The display device of claim 1, wherein the organic layer has a substantially flat surface on the via layer, and wherein the first electrode is above the substantially flat surface.

3. The display device of claim 1, wherein the first electrode completely covers the first area of the organic layer, and overlaps a portion of the second area of the organic layer.

4. The display device of claim 1, further comprising a pixel-defining layer over the first electrode, wherein the pixel-defining layer defines a second opening overlapping with the emission area.

5. The display device of claim 4, wherein the first electrode is exposed by the second opening, wherein the emission layer is in the second opening, and wherein the second electrode is above the pixel-defining layer.

6. The display device of claim 4, wherein the second area of the organic layer overlaps the pixel-defining layer.

7. The display device of claim 4, further comprising a bank pattern above the pixel-defining layer, and wherein the second electrode covers the pixel-defining layer and the bank pattern.

8. The display device of claim 1, wherein the first electrode is not in direct contact with the via layer.

9. The display device of claim 1, wherein the first electrode is not in the first opening of the via layer.

10. The display device of claim 1, wherein the emission layer comprises a hole-transporting layer, an organic emission layer, and an electron-transporting layer, which are sequentially arranged.

11. The display device of claim 1, further comprising:

a color filter above the second electrode; and an optical layer above the color filter, and comprising a pancake lens.

12. The display device of claim 1, wherein the first opening overlaps the emission area.

13. The display device of claim 1, wherein the organic layer comprises poly(3,4-ethylenedioxythiophene):poly(styrenesulfonate) (PEDOT:PSS).

14. The display device of claim 1, further comprising a pixel circuit layer above the substrate, the pixel circuit layer comprising a first transistor, a gate-insulating layer, and a protective layer, wherein the first transistor comprises:

a semiconductor pattern covered by the gate-insulating layer;

a gate electrode above the gate-insulating layer; and a first terminal and a second terminal connected to the semiconductor pattern, and wherein the transistor electrode is electrically connected to one of the first terminal and the second terminal.

15. A method of manufacturing a display device, the method comprising:

forming a transistor electrode on a substrate comprising an emission area and a non-emission area;

forming, over the transistor electrode, a via layer defining a first opening exposing the transistor electrode;

forming, on the via layer, an organic layer forming a flat surface by filling the first opening;

forming, on the organic layer, a first electrode electrically connected to the transistor electrode;

forming an emission layer on the first electrode; and forming a second electrode over the emission layer, wherein the organic layer comprises a first area overlapping the emission area, and a second area overlapping the non-emission area, and wherein the first area comprises a conductive organic layer, and wherein the second area comprises a non-conductive organic layer.

16. The method of claim 15, further comprising forming a pixel-defining layer defining a second opening exposing the first electrode, wherein the forming of the emission layer on the first electrode comprises forming the emission layer on the first electrode exposed through the second opening.

17. The method of claim 16, further comprising forming a bank pattern on the pixel-defining layer, wherein the forming of the second electrode comprises covering the pixel-defining layer and the bank pattern with the second electrode.

18. The method of claim 15, wherein the forming of the organic layer comprises:

entirely applying an organic material on the via layer;

heat-treating the organic material;

patterning the first area of the organic layer, which corresponds to the emission area; and exposing an insulation solution to the second area of the organic layer, which corresponds to the non-emission area.

* * * * *